(12) United States Patent
Chang et al.

(10) Patent No.: US 12,300,734 B2
(45) Date of Patent: May 13, 2025

(54) SEMICONDUCTOR DEVICE HAVING AIR GAP AND METHOD OF FABRICATING THEREOF

(71) Applicant: Taiwan Semiconductor Manufacturing Company, Ltd., Hsinchu (TW)

(72) Inventors: Chia-Hao Chang, Hsinchu (TW); Lin-Yu Huang, Hsinchu (TW); Sheng-Tsung Wang, Hsinchu (TW); Cheng-Chi Chuang, New Taipei (TW); Kuan-Lun Cheng, Hsin-Chu (TW); Chih-Hao Wang, Hsinchu County (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 489 days.

(21) Appl. No.: 17/446,419

(22) Filed: Aug. 30, 2021

(65) Prior Publication Data

US 2023/0067799 A1 Mar. 2, 2023

(51) Int. Cl.
*H01L 29/49* (2006.01)
*H01L 21/28* (2006.01)
*H01L 29/66* (2006.01)
*H01L 29/78* (2006.01)

(52) U.S. Cl.
CPC .... *H01L 29/4991* (2013.01); *H01L 21/28123* (2013.01); *H01L 29/66545* (2013.01); *H01L 29/6681* (2013.01); *H01L 29/7851* (2013.01)

(58) Field of Classification Search
None
See application file for complete search history.

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 2013/0285116 A1 | 10/2013 | Lochtefeld et al. |
| 2019/0334008 A1* | 10/2019 | Chen .................... H01L 29/6653 |
| 2020/0091311 A1 | 3/2020 | Hsu et al. |
| 2020/0105930 A1* | 4/2020 | Yang .................... H01L 29/0847 |
| 2020/0243666 A1* | 7/2020 | Ching ............. H01L 21/823431 |
| 2021/0257480 A1 | 8/2021 | Jhan et al. |

* cited by examiner

*Primary Examiner* — Suberr L Chi
*Assistant Examiner* — Carnell Hunter, III
(74) *Attorney, Agent, or Firm* — Haynes and Boone, LLP

(57) ABSTRACT

Methods and devices that provide for a fin structure and a dielectric fin structure. A gate structure is formed over the fin structure and the hybrid fin structure. A plurality of dielectric layers is adjacent the gate structure and over the hybrid fin structure between the gate structure and a contact element over the dielectric fin structure. The plurality of dielectric layers includes an air gap, formed by removal of a dummy spacer layer.

20 Claims, 27 Drawing Sheets

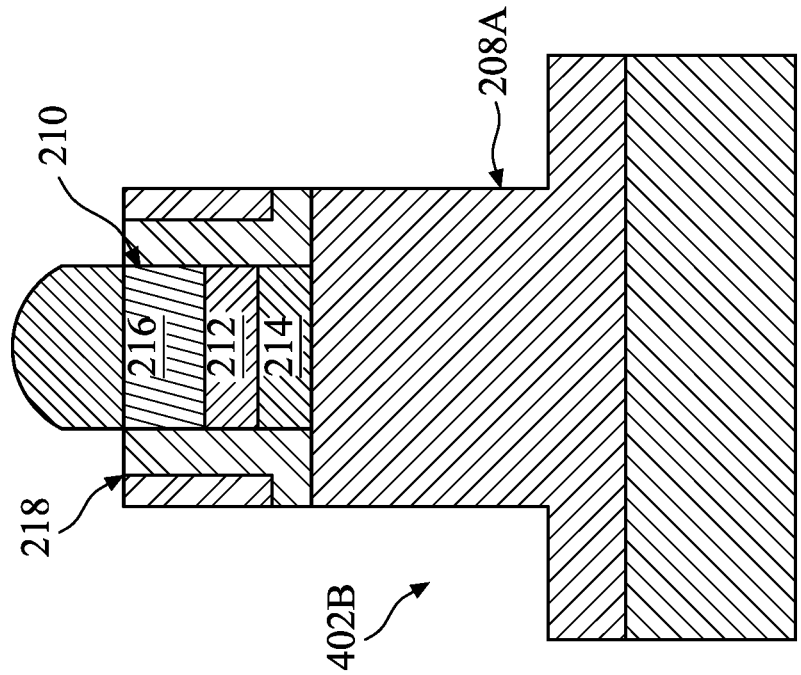
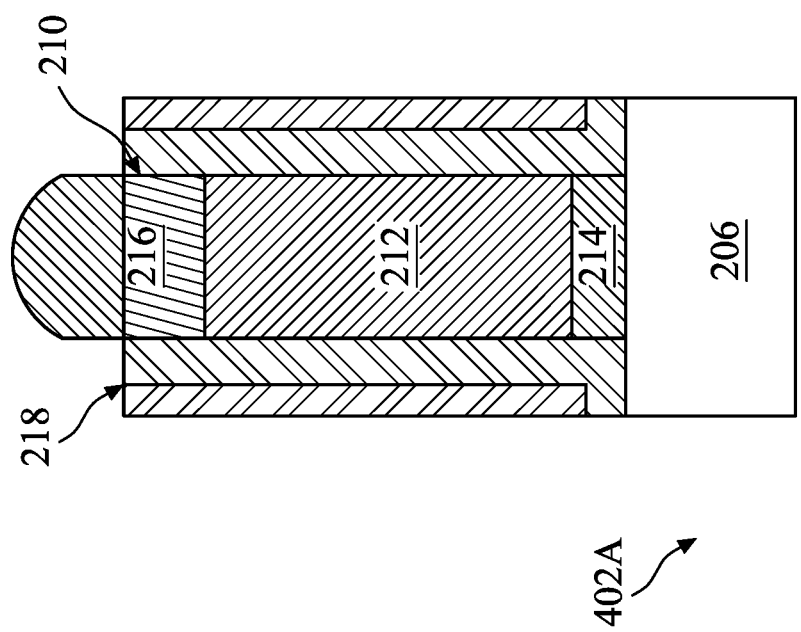
FIG. 4B
FIG. 4A

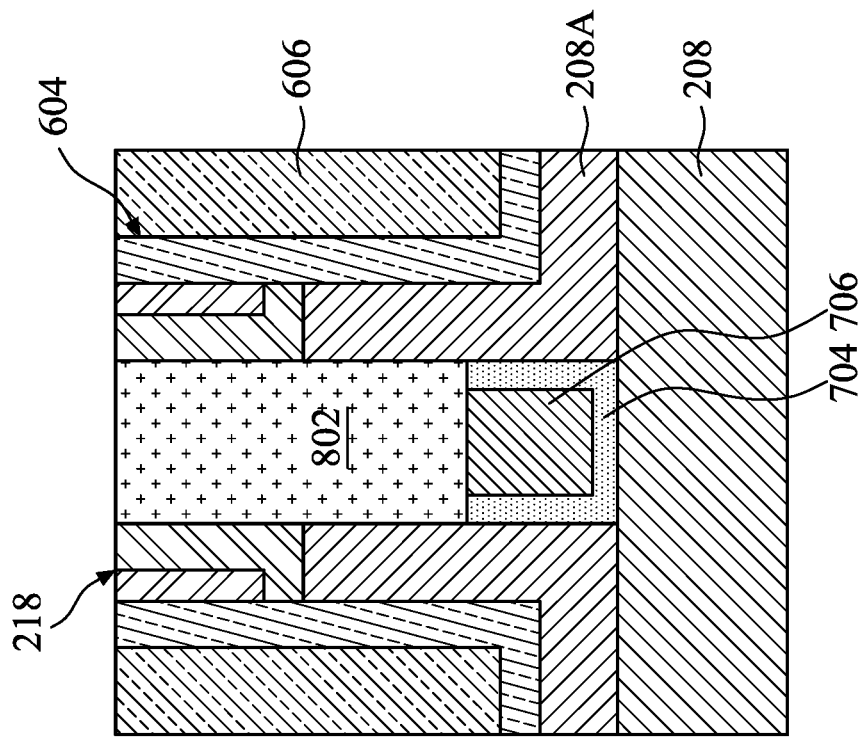
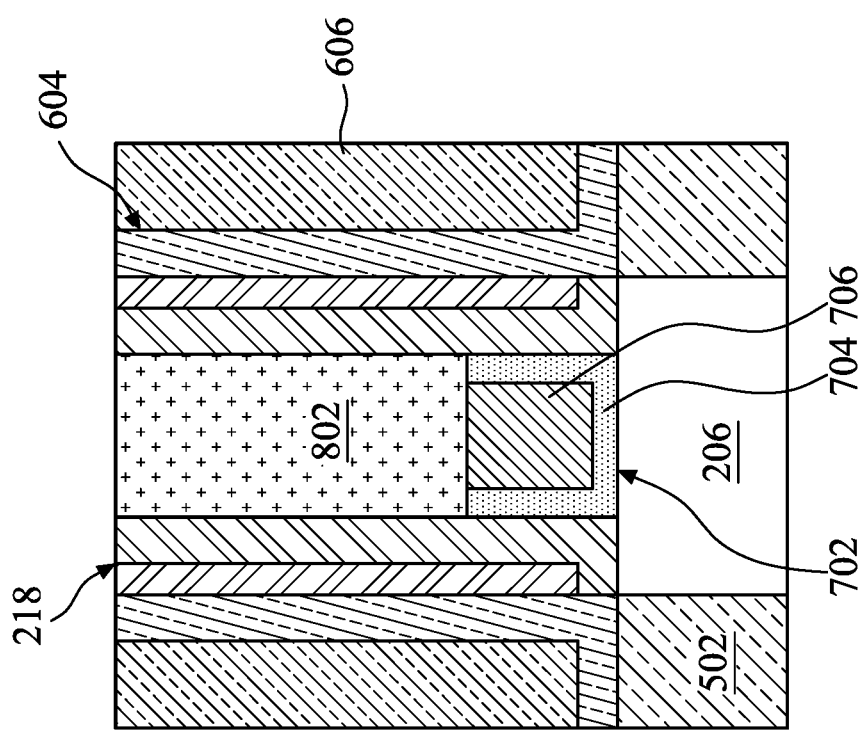
FIG. 8A
FIG. 8B

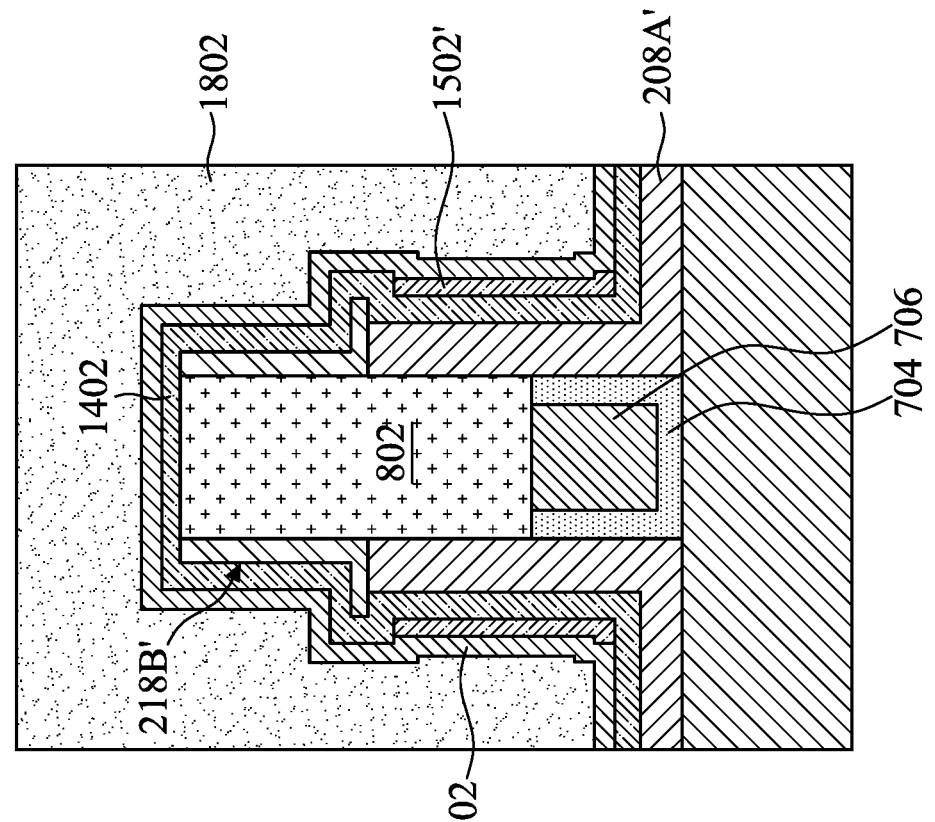
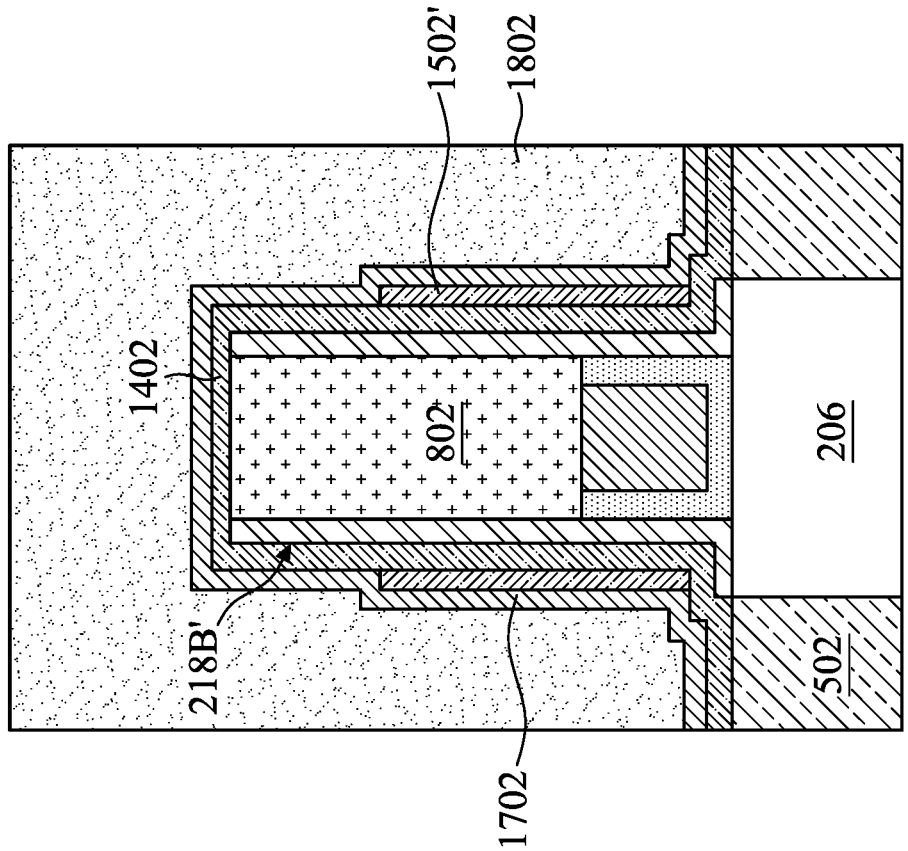
FIG. 18A
FIG. 18B

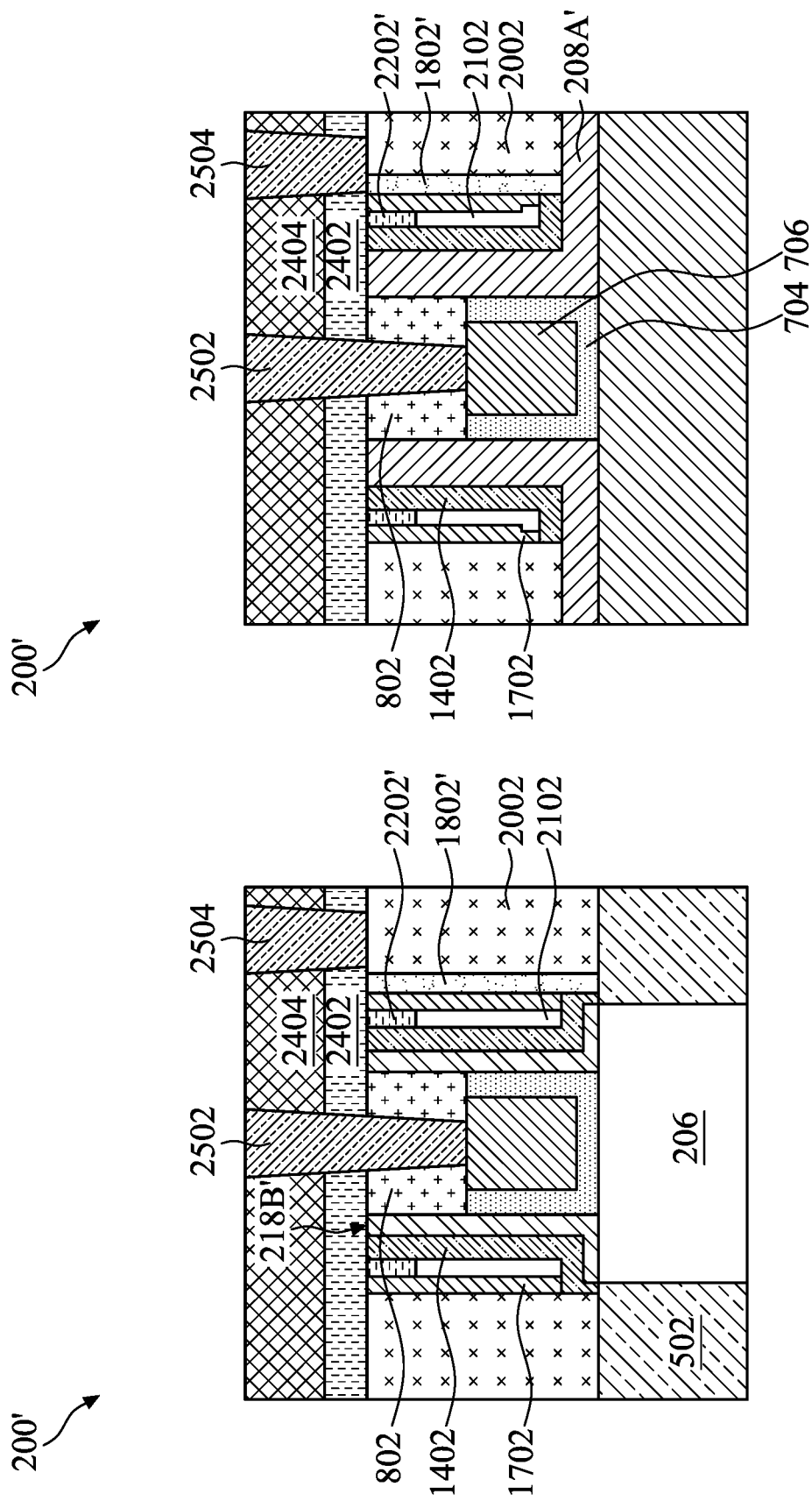

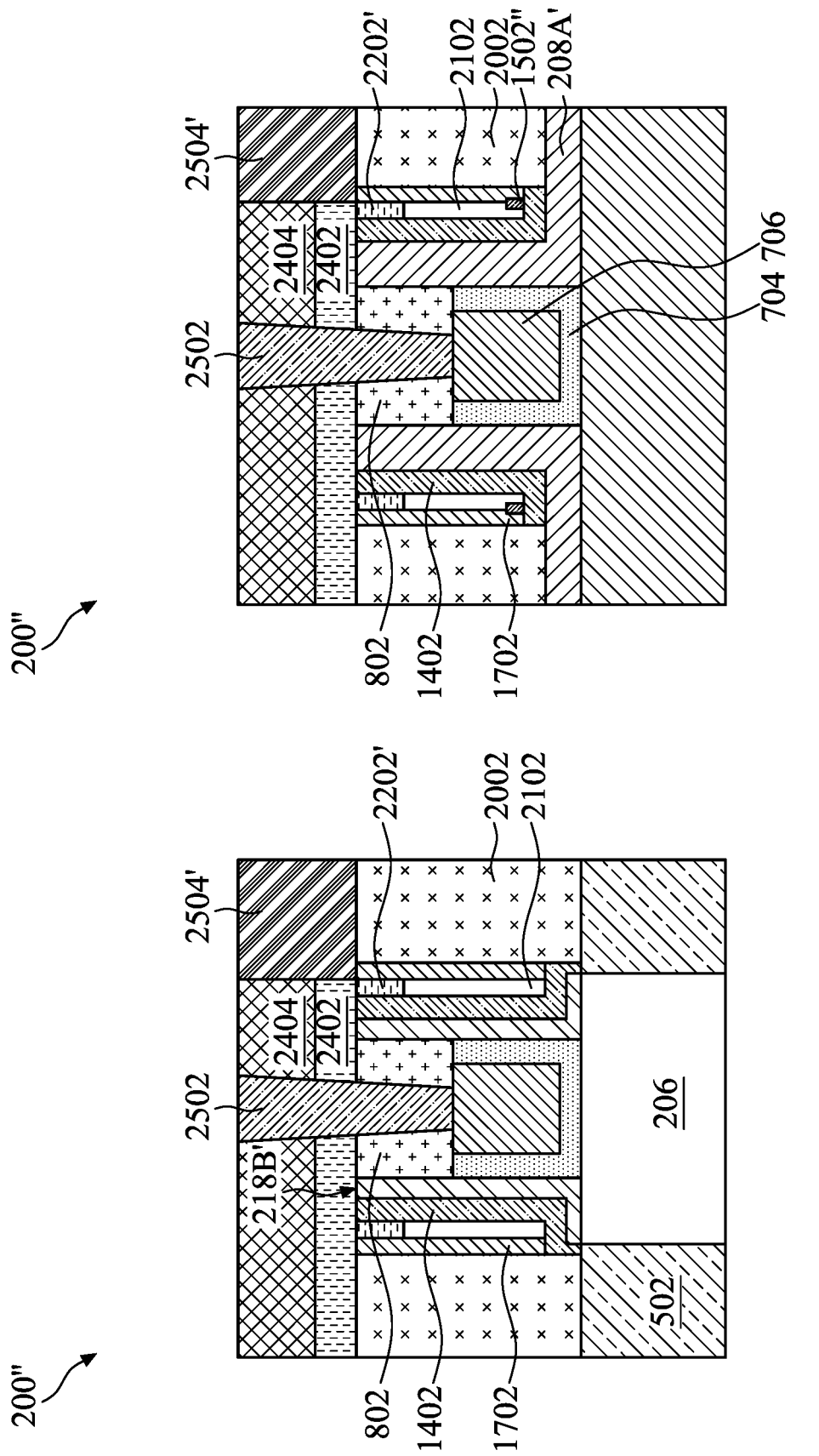

SEMICONDUCTOR DEVICE HAVING AIR GAP AND METHOD OF FABRICATING THEREOF

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFET devices enable aggressive scaling down of IC technologies, maintaining gate control and mitigating SCEs, while seamlessly integrating with conventional IC manufacturing processes. However, as semiconductor devices continue to scale, challenges arise in achieving desired density and performance. For example, addressing capacitance between adjacent conductive features of a device is needed to affecting device performance, for example, providing a desired operating speed. Accordingly, although existing devices and methods for fabricating such have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 3B, 4A, 4B, 5A, 5B, 6A, 6B, 7A, 7B, 8A, 8B, 9A, 9B, 10A, 10B, 11A, 11B, 12A, 12B, 13A, 13B, 14A, 14B, 15A, 15B, 16A, 16B, 17A, 17B, 18A, 18B, 19A, 19B, 20A, 20B, 21A, 21B, 22A, 22B, 23A, 23B, 24A, 24B, 25A, and 25B provide cross-sectional views of an exemplary semiconductor device fabricated according to one or more steps of the method of FIG. 1;

FIGS. 26A and 26B provide an alternative embodiment of an exemplary semiconductor device that may be fabricated according to one or more steps of the method of FIG. 1; and FIGS. 27A and 27B provide another alternative embodiment of an exemplary semiconductor device that may be fabricated according to one or more steps of the method of FIG. 1.

DETAILED DESCRIPTION

Figure 1:
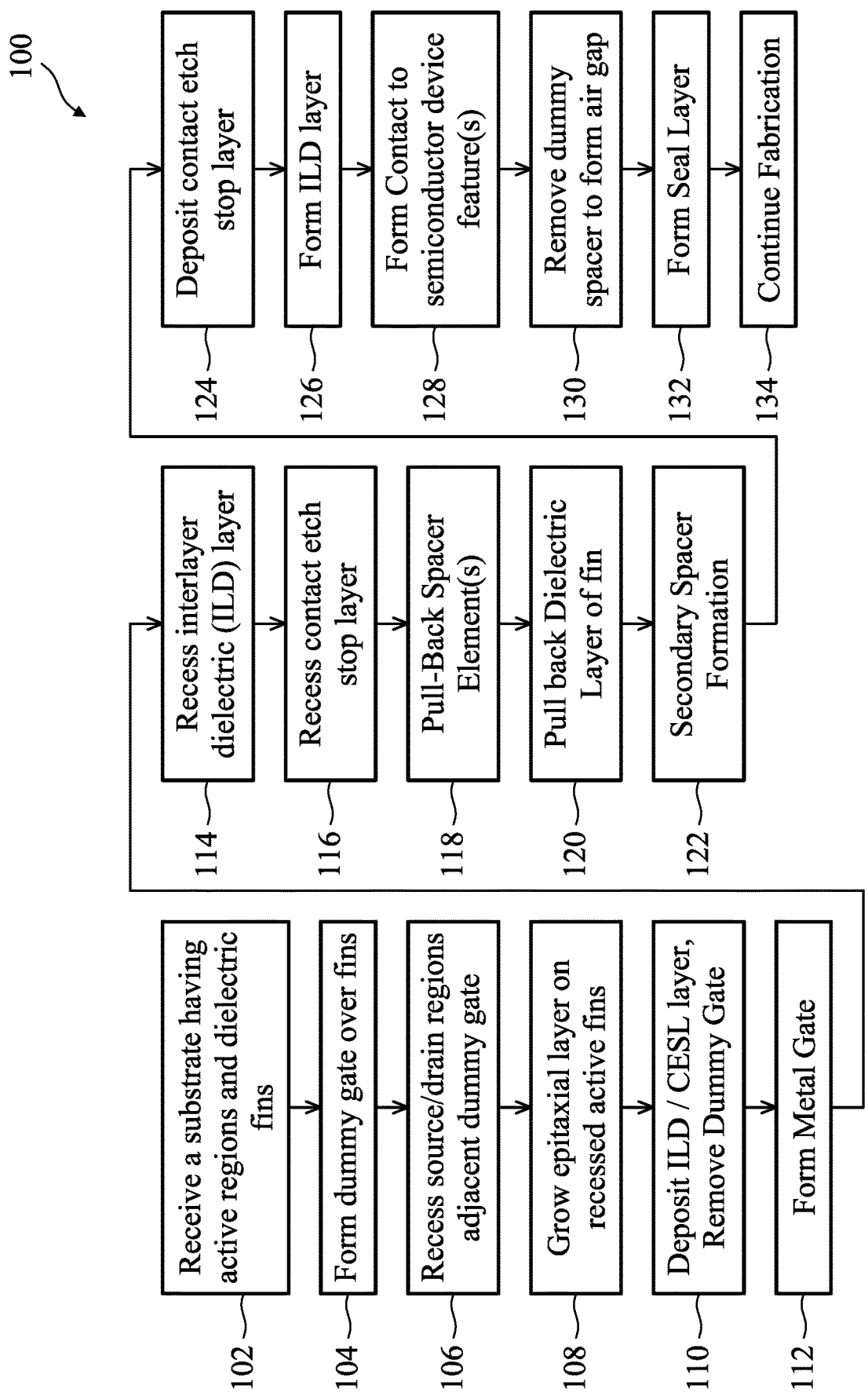
FIG. 1 is a flow chart of a method of fabricating a semiconductor device providing an air spacer adjacent a hybrid fin according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices. In each case an active region for example having a structure of a "fin" is provided and an adjacent isolation structure, similarly having a structure of a "fin," but comprising dielectric materials may separate active regions.

In FIG. 1, illustrated is a method 100 of fabricating a semiconductor device (e.g., such as that including a plurality of FinFET devices), in accordance with one or more embodiments. In some embodiments, the method 100 may be used to fabricate the device 200, described below with reference to FIGS. 2-25B. It is understood that parts of the method 100 and/or the semiconductor device 200 may be fabricated by a well-known CMOS technology process flow, and thus some processes are only briefly described herein.

The method 100 begins at block 102 where a semiconductor structure is received, the semiconductor structure having a plurality of active fins and a plurality of hybrid fins (also referred to as dielectric fins and/or dummy fins). The active fins are fin-element structures that vertically extend above a semiconductor structure and provide elements of semiconductor devices, such as a channel region. The hybrid fins are fin-element structures comprising dielectric material that likewise vertically extend above a semiconductor substrate, but do not include a channel of an active device (e.g., transistor). The hybrid fins may be formed within a region of the device for a given device type (e.g., PMOS) and/or may be formed at a boundary between areas of different device types (e.g., a boundary between NMOS and PMOS devices).

Figure 2:
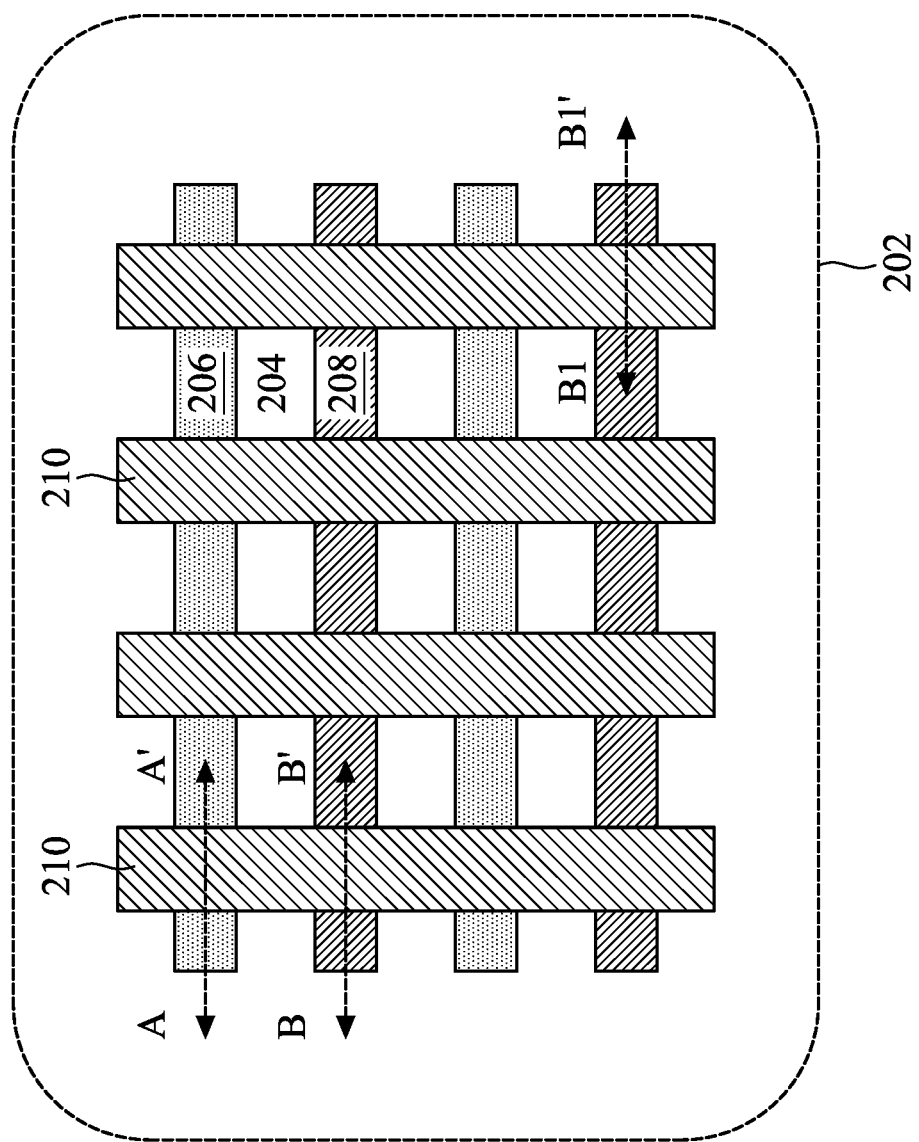
FIG. 2 is a top view of a multi-gate device according to one or more aspects of the present disclosure.

Illustrated in FIG. 2 illustrates a schematic top-view a semiconductor device 200. In an embodiment, the semiconductor device 200 includes one or more fin-based, multi-gate field-effect transistors (FETs). The semiconductor device is formed on a substrate 202 and includes a plurality of fin-elements 206 extending vertically above the substrate 202 and extending in a first (x-axis) direction. The fin-elements 206 provide the active regions of the semiconductor device. The semiconductor device 200 also includes a plurality of hybrid fins 208, which may also be referred to as dielectric fins or dummy fins. The hybrid fins 208 comprise dielectric material and do not include a channel of an active device (e.g., transistor). A plurality of gate structures or lines 210 run orthogonal to the active fins 206 and hybrid fins 208. The gate structure 210 is formed on and around the fin-elements 206 and 208. A FET is formed where a gate structure 210 overlaps the active regions of the fin element 206. In some embodiments, isolation features 204 extend between the fin structures.

The substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, in some embodiments, the substrate 202 may include an epitaxial layer (epi-layer), the substrate 202 may be strained for performance enhancement, the substrate 202 may include an SOI structure, and/or the substrate may have other suitable enhancement features.

The fin structure 206, like the substrate 202, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 206 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the making element may be performed using an electron beam (e-beam) lithography process. The masking element may then be used to protect regions of the substrate, while an etch process forms recesses into the substrate (e.g., silicon) layer, thereby leaving an extending fin 206. The recesses may be etched using a dry etch (e.g., chemical oxide removal), a wet etch, and/or other suitable processes. Numerous other embodiments of methods to form the fins 206 on the substrate 202 may also be used.

Each of the plurality of fins 206 also include a source region and a drain region, where the source/drain regions will be formed in, on, and/or surrounding the fin 206 in the source/drain regions which are disposed on opposing sides of the gate structure 210 as discussed below. A channel region of a transistor is disposed within the fin 206, underlying the gate structure 210.

The isolation regions 204 may be shallow trench isolation (STI) features. Alternatively, a field oxide, a LOCOS feature, and/or other suitable isolation features may be implemented on and/or within the substrate 202. The isolation regions 204 may be composed of silicon oxide, silicon nitride, silicon oxynitride, fluorine-doped silicate glass (FSG), a low-k dielectric, combinations thereof, and/or other suitable material. In an embodiment, the isolation structures are STI features and are formed by etching trenches in the substrate 202. The trenches may then be filled with isolating material, followed by a chemical mechanical polishing (CMP) process. However, other embodiments are possible. In some embodiments, the isolation regions 204 may include a multi-layer structure, for example, having one or more liner layers.

Hybrid fins 208 include isolation materials and are similarly shaped to the active fins 206. The hybrid fins 208 may differ in width from the active fins 206. In some examples, the hybrid fins 208 may be formed after the fins 206. For example, in some embodiments, the isolation regions 204 interposing the fins 206 may be patterned (e.g., using a photolithography and etching process) to form trenches within the isolation regions 204 and within which the hybrid fins 208 will be formed. Alternatively, the dielectric material used to form the isolation regions 204 may be deposited conformally over the fins 206, such that the conformal deposition itself forms trenches within the isolation regions 204 and between adjacent fins 206, within which the hybrid fins 208 will be formed. Regardless of how they are fabricated, one or more isolation materials are used to form the hybrid fins 208. In some cases, the isolation material used to form the hybrid fins 208 may include a layer of a low-K (LK) material including SiCN, SiOC, SiOCN, or another low-K material (e.g., with a dielectric constant 'k'<7) and a layer of a high-K (HK) material including $HfO_2$, $ZrO_2$, HfAlOx, $HfSiO_x$, $Al_2O_3$, or another high-K material (e.g., with a dielectric constant 'k'>7). For example, in some embodiments, the isolation material used to form the hybrid fins 208 may include a first layer and a second layer formed over the first layer, where the first layer includes a dielectric material (such as LK material or oxide), and where the second layer includes a HK material (such as a HK material noted above). In some embodiments, hybrid fins 208 may effectively prevent the undesirable lateral merging of the source/drain feature (e.g., epitaxially grown layers) formed on adjacent fins 206.

Figure 3B:
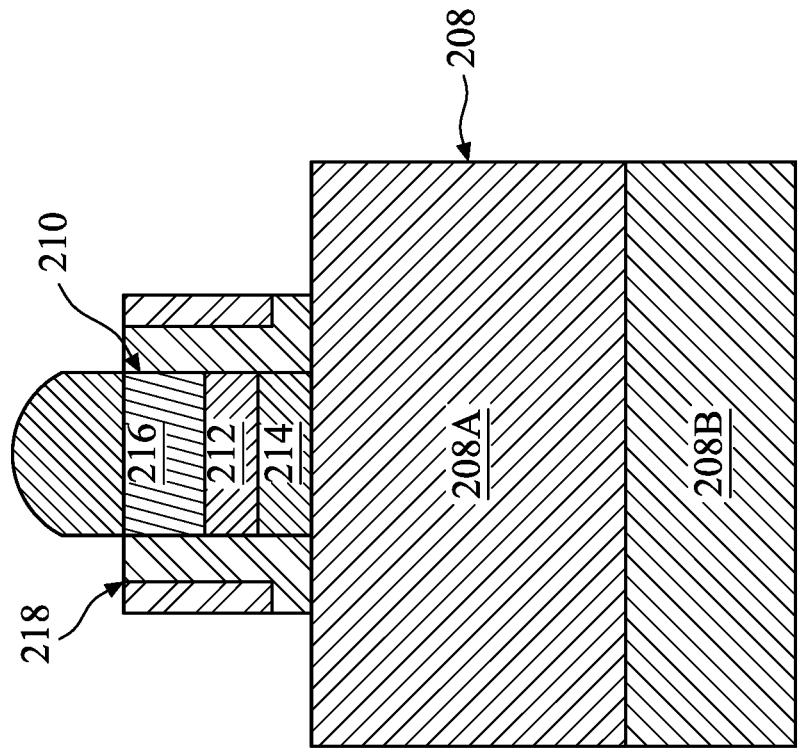
Figure 3A:
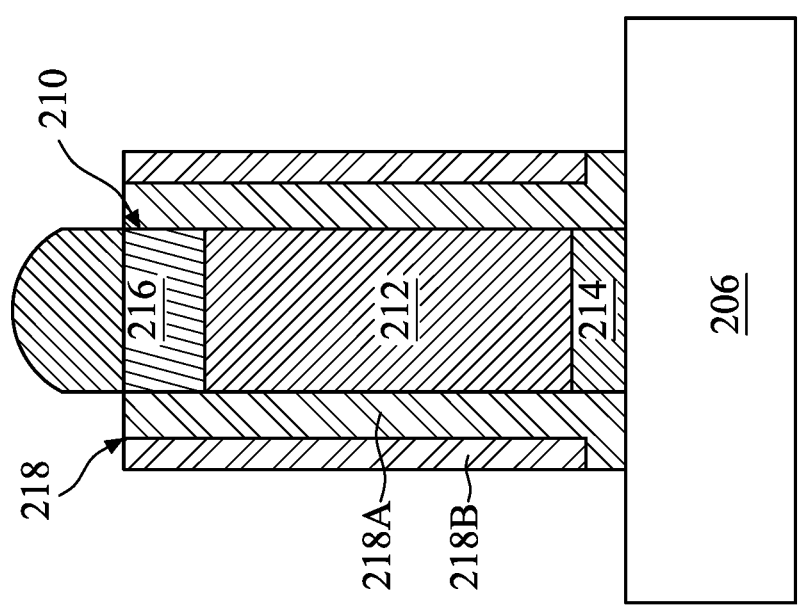

FIG. 3B illustrates a hybrid fin 208 having a first layer 208B and an overlying second layer 208A. In an embodiment, the second layer 208A is a HK material. Exemplary compositions for the second layer 208A include HfO, LaO, AlO, LaO, ZnO, YO, ZrAlO, TiO, TaO, ZrO, combinations thereof, and/or other suitable materials. The first layer 208B may comprise a different dielectric material, for example, that has a lower dielectric constant. In some implementations, the first layer 208B is a low-K material such as a material including silicon and nitrogen.

Returning to FIG. 2, illustrated are gate structure 210. The gate structure 210 may be substantially similar to the dummy gate structure discussed below and/or the metal gate structure of the final semiconductor device. The gate structure 210 includes a gate stack having a gate dielectric layer, and an electrode layer formed over the gate dielectric layer as discussed in further detail below. The composition of the gate structure 210 may vary as to whether it is intended to form the gate of an n-type transistor or a p-type transistor.

In that respect, the semiconductor device 200 may include n-type transistors (NFET) and p-type transistors (PFET). For example, some fins 206 or portions thereof may be suitable for NMOS transistor device formation, while other fins 206 or portions thereof may be suitable for PMOS transistor device formation. Further, the semiconductor device 200 may include various other devices and features, such as additional transistors, bipolar junction transistors, resistors, capacitors, diodes, fuses, etc., but is simplified for a better understanding of the inventive concepts of the present disclosure. Further, in some embodiments, the semiconductor device 200 includes a plurality of semiconductor devices (e.g., transistors), which may be interconnected. Various contacts (not shown) may extend from the device features to overlying multi-layer interconnect (MLI). An MLI electrically couples various devices (for example, p-type transistors and/or n-type transistors of the device 200, resistors, capacitors, and/or inductors) and/or components (for example, gate electrodes and/or epitaxial source/drain features of p-type transistors and/or n-type transistors of the device 200), such that the various devices and/or components can operate as specified by design requirements of the device 200. MLI feature includes a combination of dielectric layers and electrically conductive layers (e.g., metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of MLI feature. The contact elements and/or conductive vias discussed below may be included in the MLI feature. During operation, the interconnect features are configured to route signals between the devices and/or the components of the device 200 and/or distribute signals (for example, clock signals, voltage signals, and/or ground signals) to the devices and/or the components of the device 200. In various embodiments, the device 200 may be an intermediate device fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), high voltage transistors, high frequency transistors, other memory cells, and/or combinations thereof.

Three cross-sectional cut markings are provided on the schematic top view of the device 200 in FIG. 2. Cross-sectional cut A-A' provides a cut along the active fin-element 206; cross-sectional cut B-B' provides a cut along the hybrid fin-element 208 of the same gate structure as cut A-A'; cross-sectional cut B1-B1' provides a cut along the hybrid fin-element 208 of a different gate structure as cut A-A'. Each of the following Figures denoted "A" correspond to the A-A' on-fin cut (e.g., FIGS. 3A, 4A, 5A and so forth). Each of the following Figures denoted "B" correspond to the on-hybrid fin cuts (e.g., FIGS. 3B, 4B, 5B, and so forth). It is noted that the Figures corresponding to the "B" are illustrative of both the cut B-B' and the cut B1-B1'.

In block 104 of the method 100, a dummy gate structure is formed over the active regions (e.g., fins) and the hybrid fins. The dummy gate structure refers to a sacrificial structure that mimics the structure of the to-be formed functional gate in a subsequent processing step, see block 112. For example, the dummy gate structure has the dimensions of the final gate, but does not provide for current flow. Referring to the example of FIGS. 2, 3A, and 3B, a gate structure 210 providing a dummy gate structure is formed over fin 206 and the hybrid fin 208. The dummy gate structure includes a gate dielectric layer 214, a gate electrode layer 212, and a hard mask layer(s) 216. In an embodiment, the gate dielectric is an oxide material, however other dielectric compositions are also possible including high-k dielectric materials. In an embodiment, the gate electrode layer 212 is polysilicon, however other compositions may also be possible. The hard mask layer 216 is provided for suitable protective and patternable material (e.g., silicon nitride, silicon carbide) and may include multiple layers.

In some embodiments, the gate structure 210 may be formed by various process steps such as layer deposition, patterning, etching, as well as other suitable processing steps. Exemplary layer deposition processes include low-pressure CVD, CVD, plasma-enhanced CVD (PECVD), PVD, ALD, thermal oxidation, e-beam evaporation, or other suitable deposition techniques, or combinations thereof. The gate structure 210 may be provided by this deposition of materials (e.g., gate dielectric, gate electrode and hard mask materials), followed by a suitable patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process to form the gate structure 210 may include dry etching (e.g., RIE etching), wet etching, and/or other etching methods.

After patterning of the dummy gate structure, spacer elements 218 are formed on the sidewall of the structure. In an embodiment, a first spacer element 218A and a second spacer element 218B are provided, however other configurations may also be possible. The first spacer element 218A may be a L-shaped spacer abutting the sidewall of the gate structure 210. The second spacer element 218B is disposed over and on the first spacer element 218A.

The spacer elements 218 include dielectric material including silicon, oxygen, carbon, nitrogen, other suitable material, or combinations thereof (for example, silicon oxide, silicon nitride, silicon oxynitride, or silicon carbide). In an implementation, the spacer element 218A is silicon nitride and the spacer element 218B is an oxide, such as silicon oxide. Other exemplary compositions for the spacer element 218 generally and the spacer element 218A in particular are HfSi, AlON, HfO, LaO, AlO, LaO, ZrN, SiC, ZnO, SiOC, SiOCN, YO, TaCN, ZrSi, SiCN, ZrAlO, TiO, TaO, ZrO, and/or combinations thereof. The spacer elements 218 may be formed after patterning the gate structure 210 by layer deposition processes include low-pressure CVD, CVD, plasma-enhanced CVD (PECVD), PVD, ALD, thermal oxidation, e-beam evaporation, or other suitable deposition techniques, or combinations thereof followed by suitable etching back processes (e.g., anisotropic etching processes). The spacer element 218A and/or the spacer element 218B may have a thickness of between approximately 1 nanometer (nm) and approximately 10 nm. The spacer elements 218 may have a configuration defining a low-dose source/drain area and/or provide sidewalls for a trench during the gate removal process discussed below.

The method 100 then proceeds to block 106 where portions of the active fin and hybrid fin are recessed in the respective source/drain regions. (It is noted that while a source/drain structure is not formed on the hybrid fin, for ease of reference the corresponding position of the source/drain—e.g., adjacent opposing sides of the gate, is referred to as the source/drain region.) Referring to the example of FIGS. 4A and 4B, recesses 402A are formed in the fin 206 adjacent the gate structure 210 and recesses 402B are formed in the hybrid fin 208 adjacent the gate structure 210. In some implementations, the fin 206 is etched concurrently with the etching of the dielectric layer 208A of the hybrid fin 208. The recessing may be performed by suitable etching process such as a plasma-based dry etching.

Figure 5B:
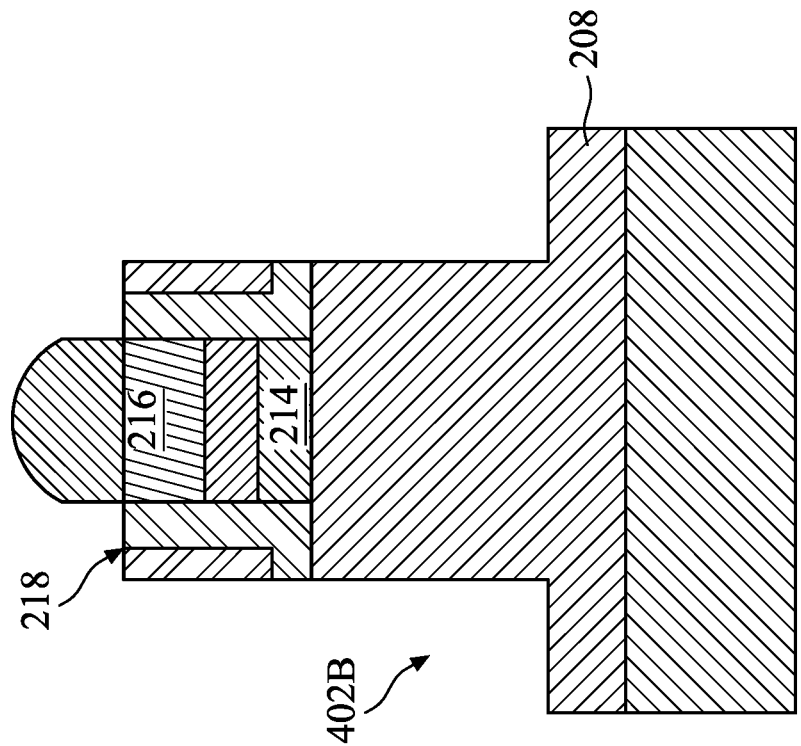
Figure 5A:
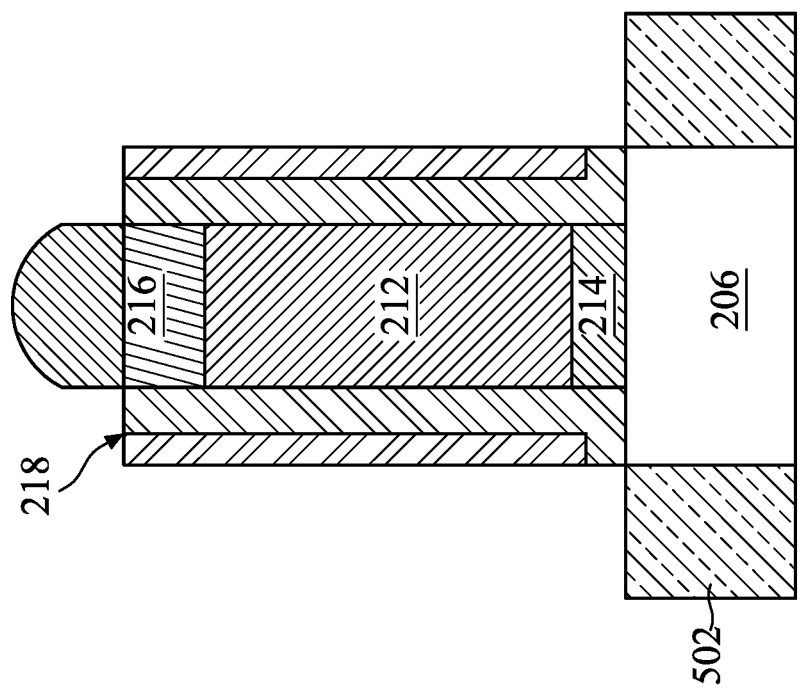
Figure 6B:
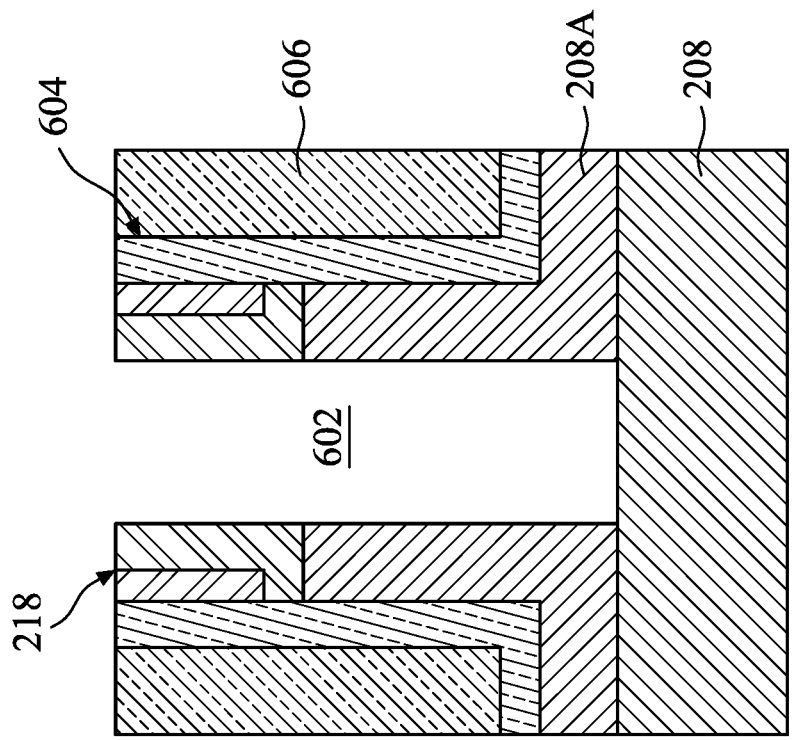
Figure 6A:
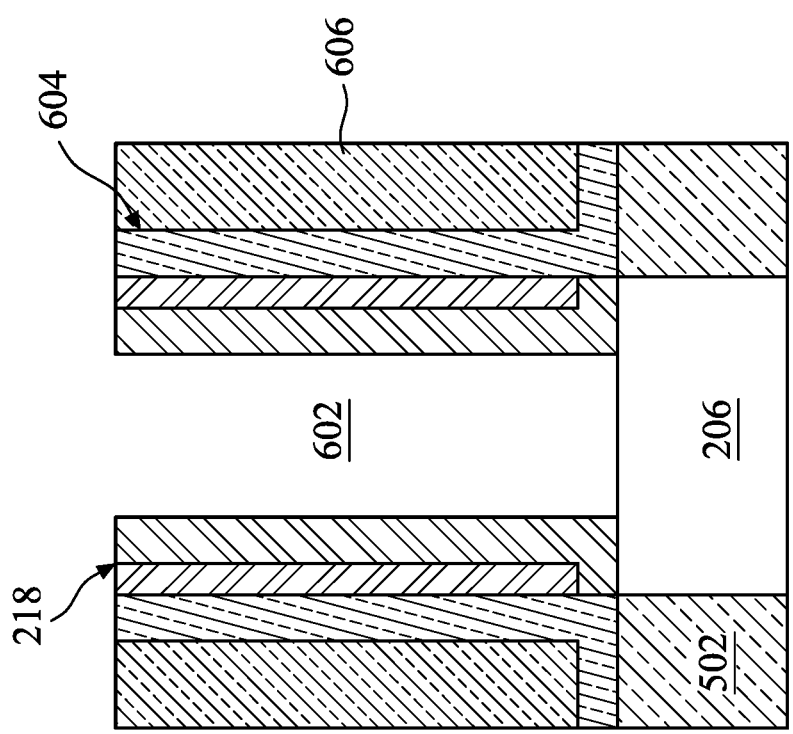

The method 100 then proceeds to block 108 where an epitaxial source/drain region is grown on the recessed active fin. Because the recessed portion of the hybrid fin is dielectric material, epitaxial growth may not occur on the hybrid fin. In some implementations, a masking layer covers the hybrid fin during the epitaxial growth process. Referring to the example of FIGS. 5A and 5B, an epitaxial source/drain feature 502 is formed on the recessed fin 206. The epitaxial source/drain feature 502 may be suitably doped such as by N-type dopants or P-type dopants based on the device. Exemplary compositions include Si:P, Si:C:P, Si:As, Si:C, SiGe, SiGe:B, and/or other suitable materials. Exemplary epitaxy techniques include but are not limited to CVD deposition techniques (e.g., vapor-phase epitaxy (VPE) and/or ultra-high vacuum CVD (UHV-CVD)), molecular beam epitaxy (MBE), and/or other suitable processes. As illustrated in FIG. 5B, the recess 402B is maintained on the hybrid fin 208.

The method 100 then proceeds to block 110 where dielectric layers such as an inter-layer dielectric (ILD) and contact etch stop layer (CESL) are formed over the device and the epitaxial source/drain regions of block 108. Referring to the example of FIGS. 6A and 6B, a CESL 604 and an ILD layer 606 are formed. ILD layer 606 includes a dielectric material including, for example, silicon oxide, carbon doped silicon oxide, silicon nitride, silicon oxynitride, TEOS-formed oxide, PSG, BSG, BPSG, FSG, Black Diamond® (Applied Materials of Santa Clara, California), xerogel, aerogel, amorphous fluorinated carbon, parylene, BCB-based dielectric material, SiLK (Dow Chemical, Midland, Michigan), polyimide, other suitable dielectric material, or combinations thereof. In some embodiments, ILD layer 606 includes a dielectric material having a dielectric constant that is less than a dielectric constant of silicon dioxide (e.g., k<3.9). In some embodiments, ILD layer 606 includes a dielectric material having a dielectric constant that is less than about 2.5 (i.e., an extreme low-k (ELK) dielectric material), such as SiO2 (for example, porous silicon dioxide), silicon carbide (SiC), and/or carbon-doped oxide (for example, a SiCOH-based material (having, for example, Si—CH3 bonds)), each of which is tuned/configured to exhibit a dielectric constant less than about 2.5. ILD layer 606 can include a multilayer structure having multiple dielectric materials. The CESL 604 may include a different dielectric material than the ILD layer, for example, the CESL 604 may be comprised of silicon and nitrogen, such as silicon nitride or silicon oxynitride. In some implementations, the materials of the CESL 604 and/or the ILD 606 are deposited by deposition processes (such as CVD, PVD, ALD, HDPCVD, MOCVD, RPCVD, PECVD, LPCVD, ALCVD, APCVD, FCVD, HARP, HDP, other suitable methods, or combinations thereof). After deposition, a planarization process such as chemical mechanical polish (CMP) is performed to planarize the layers and expose a top portion of the gate structure 210 (e.g., gate electrode 212).

In some implementations of the block 110, the dummy structure is then removed providing for an opening or trench 602 as part of a replacement gate process. The gate dielectric 214 and/or the gate electrode 212 may be removed by an etching process such as a dry etching process, a wet etching process, or a combination thereof that is selective to the gate dielectric 214 and/or the gate electrode 212 materials. In an embodiment, the fin structure 206 (channel region) is exposed by the removal of the gate structure over the fin 206. The gate structure may be removed from the hybrid fin 208 exposing the first layer 208A. In an embodiment, because of a height difference between the hybrid fin 208 and the fin 206, and thus a height difference in the gate structure (e.g., gate electrode 212), the etching process sufficient to remove the gate structure from the fin 206 over etches the hybrid fin 208 creating the trench 602 extending into the layer 208A. In an embodiment, the etching process that removes the gate structure over the hybrid fin 208 includes a recessing of the dielectric material 208A with the dielectric material 208B acting as an etch stop layer.

The method 100 then proceeds to block 112, where the replacement gate process continues and a metal gate structure is formed in the openings provided by the removal of the dummy gate structures.

Figure 7B:
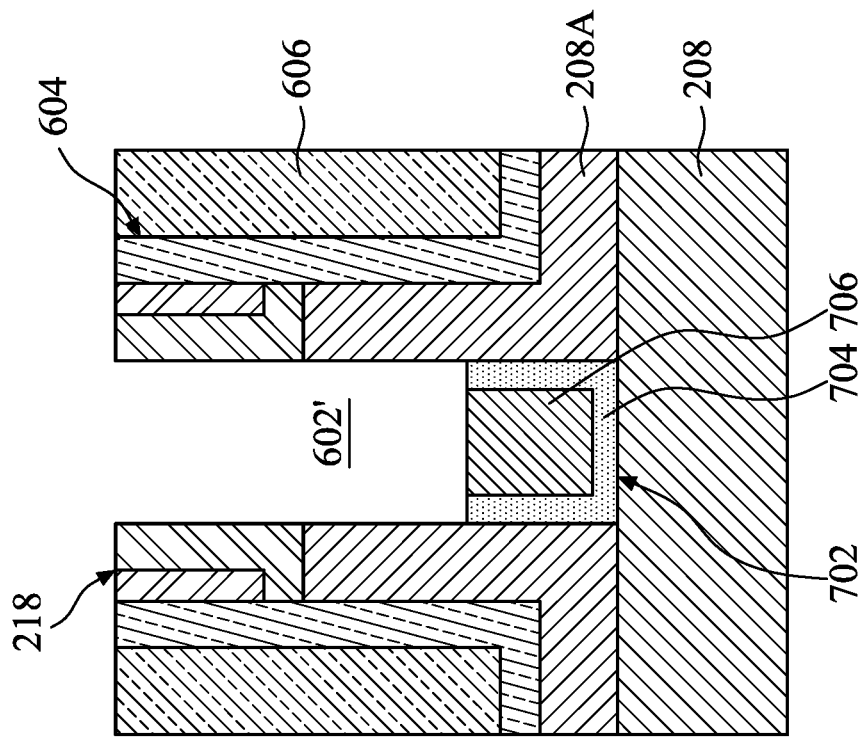
Figure 7A:
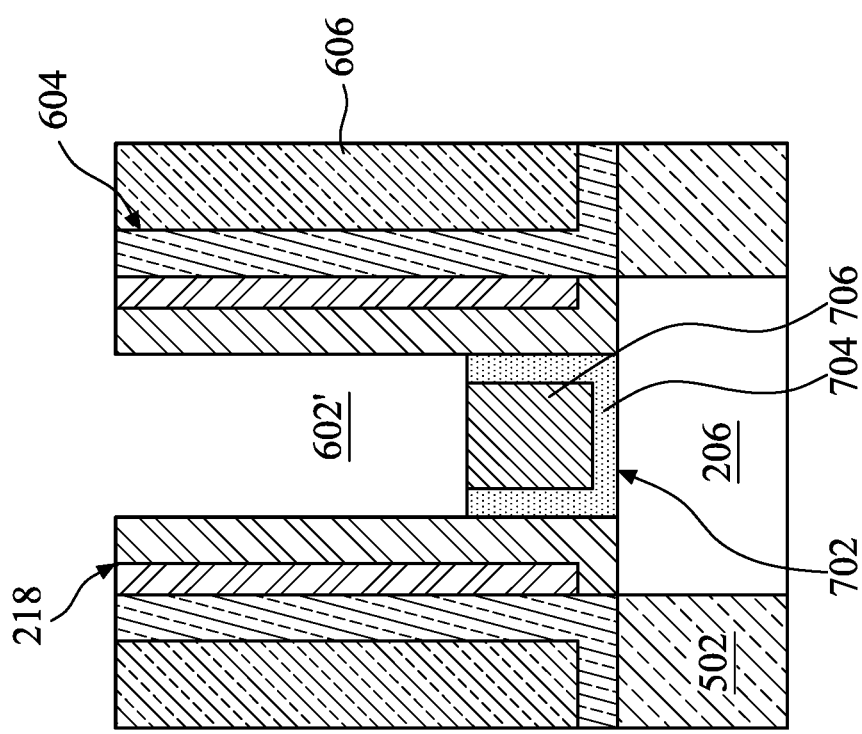

Referring to the example of FIGS. 7A and 7B, metal gate structures 702 (also referred to as metal gates and/or high-k/metal gates) are formed in gate openings 602. Metal gate structures 702 are configured to achieve desired functionality according to design requirements of device 200. Metal gate structures 702 each include a gate dielectric 704 (for example, a gate dielectric layer) and a gate electrode 706 (for example, a work function layer or layer(s) and a bulk conductive layer). Metal gate structures 702 may include numerous other layers, such as capping layers, interface layers, diffusion layers, barrier layers, hard mask layers, or combinations thereof. Gate dielectric layer 704 may include a high-k dielectric layer, for example, a dielectric material having a dielectric constant that is greater than that of silicon dioxide (k≈3.9). Exemplary compositions for the high-k gate dielectric layer include HfO2, HfSiO, HfSiO4, HfSiON, HfLaO, HfTaO, HfTiO, HfZrO, HfAlOx, ZrO, ZrO2, ZrSiO2, AlO, AlSiO, Al2O3, TiO, TiO2, LaO, LaSiO, Ta2O3, Ta2O5, Y2O3, SrTiO3, BaZrO, BaTiO3 (BTO), (Ba,Sr)TiO3 (BST), Si3N4, hafnium dioxide-alumina (HfO2-Al2O3) alloy, other suitable high-k dielectric material for metal gate stacks, or combinations thereof. The high-k dielectric layer is formed by any suitable processes, such as ALD, CVD, PVD, oxidation-based deposition process, other suitable process, or combinations thereof. In some embodiments, gate dielectric layer 704 includes an interfacial layer (e.g., oxide) disposed between the high-k dielectric layer and fin 206. Gate electrode 706 includes a conductive material, such as polysilicon, aluminum, copper, titanium, tantalum, tungsten, molybdenum, cobalt, TaN, NiSi, CoSi, TiN, WN, TiAl, TiAlN, TaCN, TaC, TaSiN, other conductive material, or combinations thereof. In some embodiments, gate electrode 706 include a work function layer and a bulk conductive layer. The work function layer is a conductive layer tuned to have a desired work function (e.g., an n-type work function or a p-type work function), and the conductive bulk layer is a conductive layer formed over the work function layer. In some embodiments, the work function layer includes n-type work function materials, such as Ti, silver, manganese, zirconium, TaAl, TaAlC, TiAlN, TaC, TaCN, TaSiN, other suitable n-type work function materials, or combinations thereof. In some embodiments, the work function layer includes a p-type work function material, such as ruthenium, Mo, Al, TiN, TaN, WN, ZrSi2, MoSi2, TaSi2, NiSi2, WN, other suitable p-type work function materials, or combinations thereof. The bulk (or fill) conductive layer includes a suitable conductive material, such as Al, W, Ti, Ta, polysilicon, Cu, metal alloys, other suitable materials, or combinations thereof. Gate electrode 706 is formed by any of the processes described herein, such as ALD, CVD, PVD, plating, other suitable process, or combinations thereof. After deposition of the gate dielectric and/or gate electrode materials, the structure may be etched back to provide a remaining opening 602'. In some implementations, as illustrated in FIGS. 8A and 8B, a self-aligned capping layer (SAC) dielectric layer 802 is formed in the opening 602'. In some embodiments, the metal gate structure 702 provided on the fin 206 is substantially identical in composition to the metal gate structure 702 provided on the hybrid fin 208. As illustrated above with reference to FIG. 2, in some implementations, the same gate line provides the metal gate structure 702 of FIGS. 7A and 7B. Again, it is noted that in some implementations the gate structure 702 over the hybrid fin 208 does not control or allow current flow within the hybrid fin 208. The SAC layer 802 may comprise SiN, HfSi, AlON, HfO, LaO, AlO, LaO, ZrN, SiC, ZnO, SiOC, SiOCN, YO, TaCN, ZrSi, SiCN, ZrAlO, TiO, TaO, ZrO, combinations thereof, and/or other suitable materials.

Figure 9A:
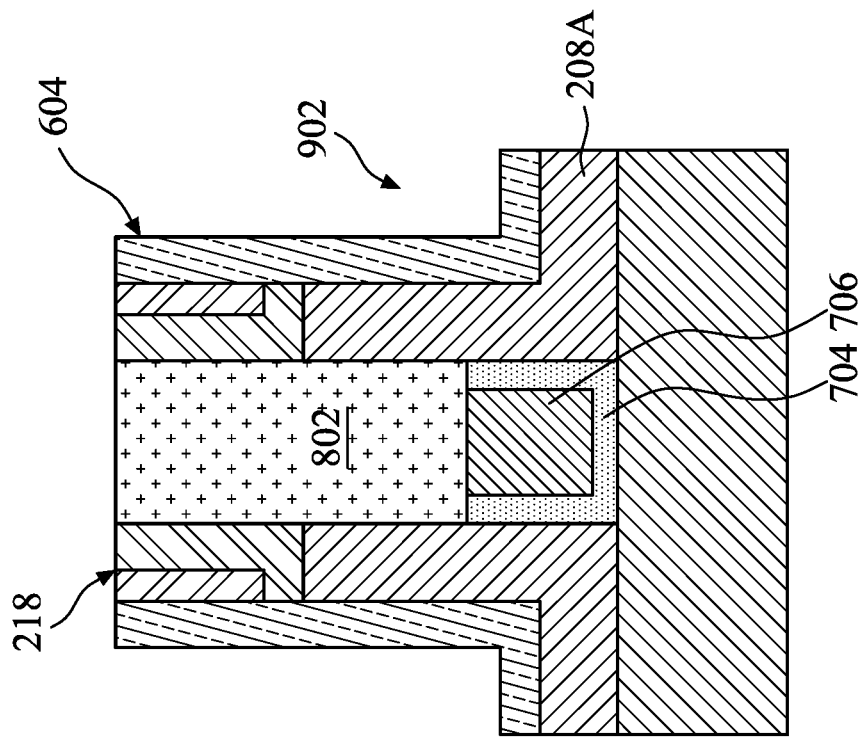
Figure 9B:
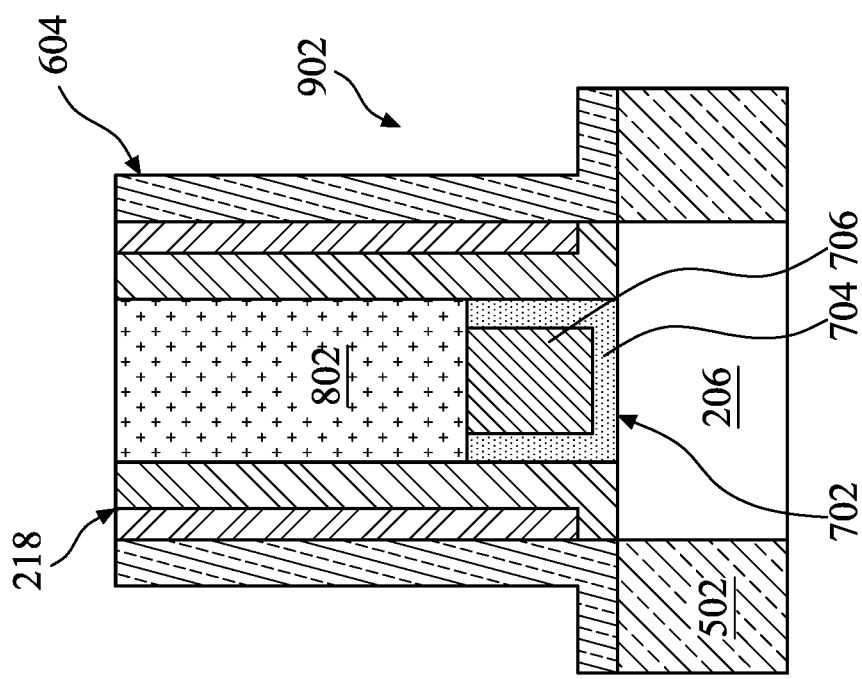

The method 100 then proceeds to block 114 where the ILD layer deposited in block 110 is recessed. In some embodiments, the ILD layer(s) are recessed to the extent that that they are removed from the structure in their entirety. In other embodiments, a patterning process provides for recessing the ILD layer(s) only adjacent the gate structure where a contact feature will be subsequently formed. As illustrated in FIGS. 9A and 9B, in some implementations, the ILD layer 606 is removed from the illustrated region adjacent the gate structure 702. The ILD layer 606 may be removed by suitable selective dry or wet etching processes. In an embodiment, the CESL layer 604 provides an etch stop for the removal of the ILD layer 606. The removal provides opening 902 over the source/drain regions 502 over the fin 206 and opening 902 in the corresponding region over the hybrid fin 208. While not illustrated in the cross-sectional view, in some implementations, the openings 902 extend in the cross-sectional direction to the adjacent gate structure (see FIG. 2).

Figure 10A:
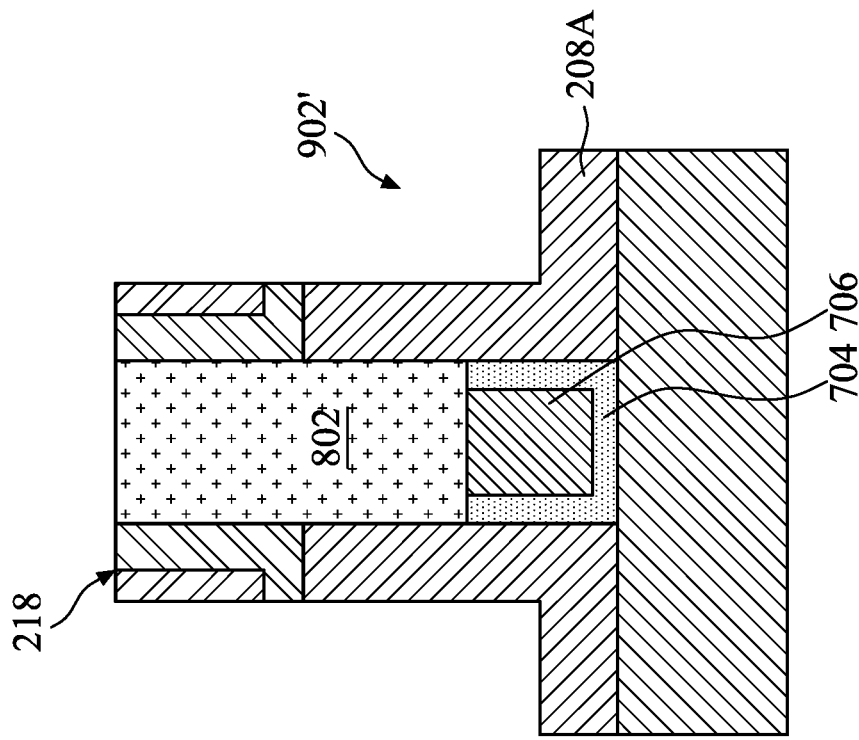
Figure 10B:
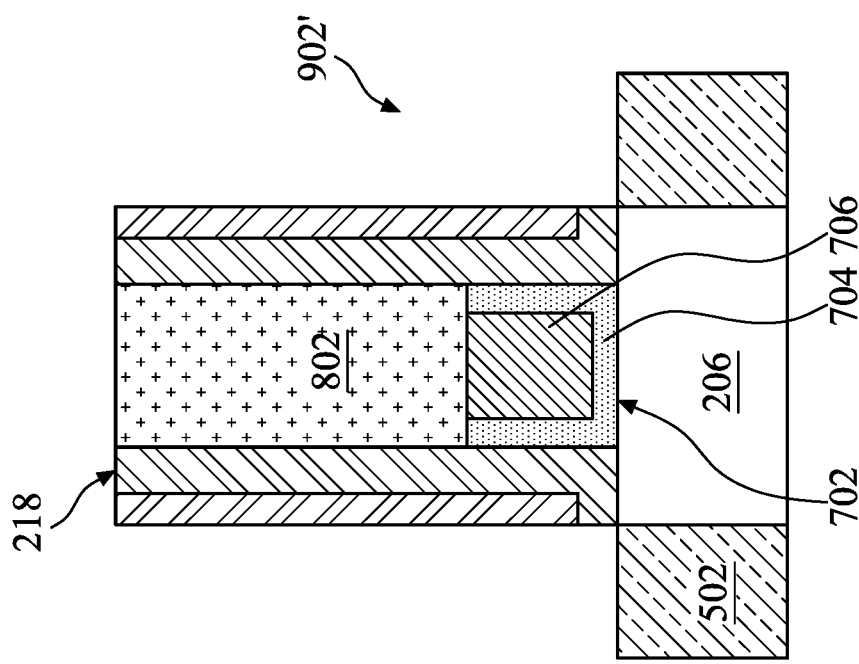
Figure 11B:
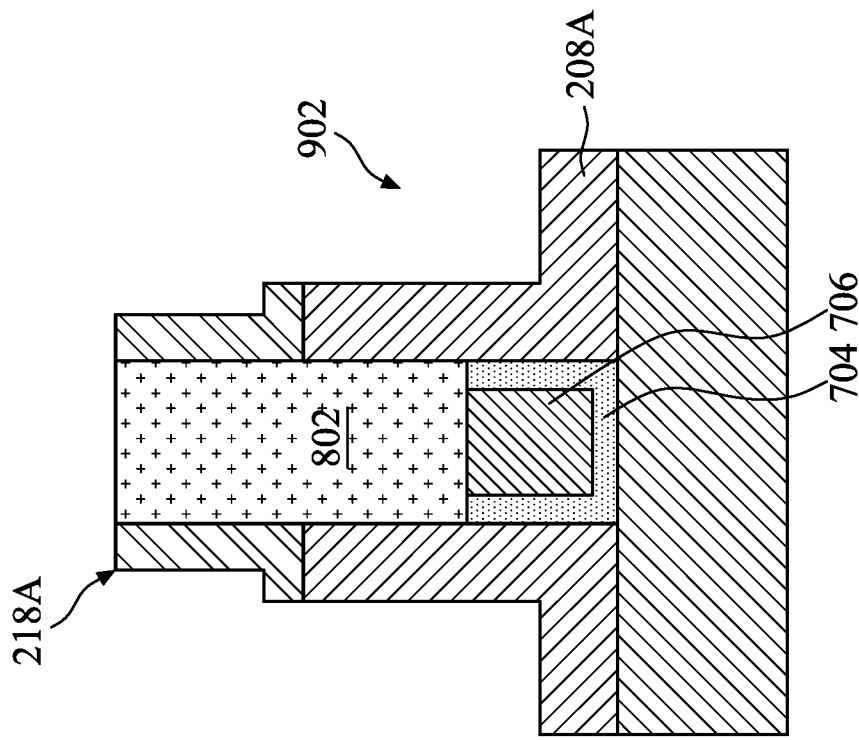
Figure 11A:
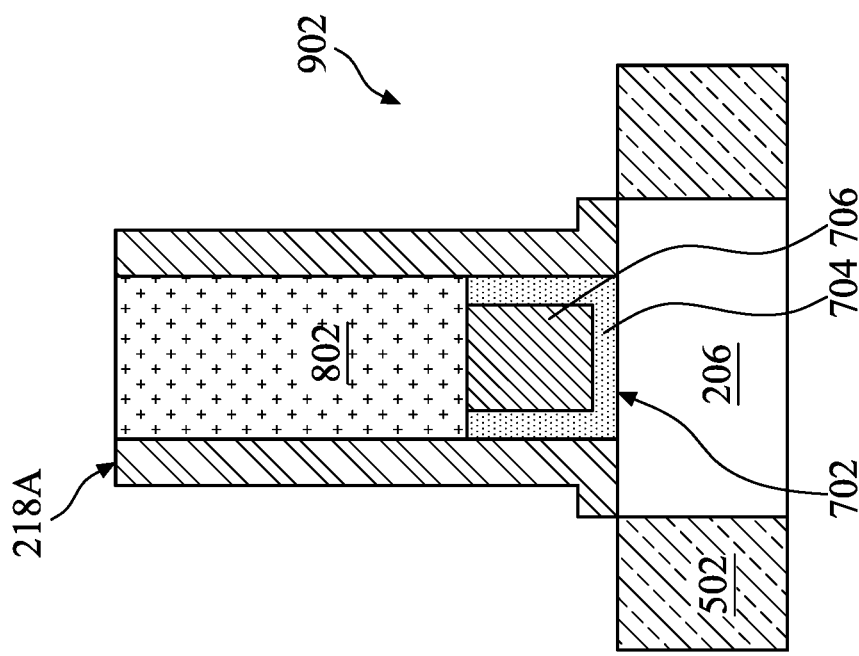

The method 100 then proceeds to block 116 where the CESL deposited in block 110 is recessed. In some implementations, the ILD layer and the CESL layer are both recessed in in-situ etching processes. In some embodiments, the CESL is recessed to the extent that that it is removed from the structure in its entirety. As illustrated in FIGS. 10A and 10B, in some implementations, the CESL 604 is removed. The CESL 604 may be removed by suitable selective dry or wet etching processes. The removal provides expanded opening 902 over the source/drain regions 502 over the fin 206 and expanded opening 902 over the corresponding area over the hybrid fin 208.

The method 100 then proceeds to block 118 where the spacer element(s) are pulled-back (e.g., etched to remove or reduce in thickness). In some implementations, the pull-back includes etching the spacer element(s) such that at least one spacer layer is decreased in width and/or removed. Referring to the example of FIGS. 11A and 11B, the spacer element 218B is removed from the structure. In an embodiment, the spacer element 218B is an oxide spacer material and the etching process to remove the spacer element 218B is selective to the oxide material. Thus, in some implementations, the etching process leaves the spacer 218A (and the dielectric layer 208A) substantially unetched. The pull-back of the spacer elements 218 by removal of spacer layer 218B again enlarges the respective openings 902.

Figure 12B:
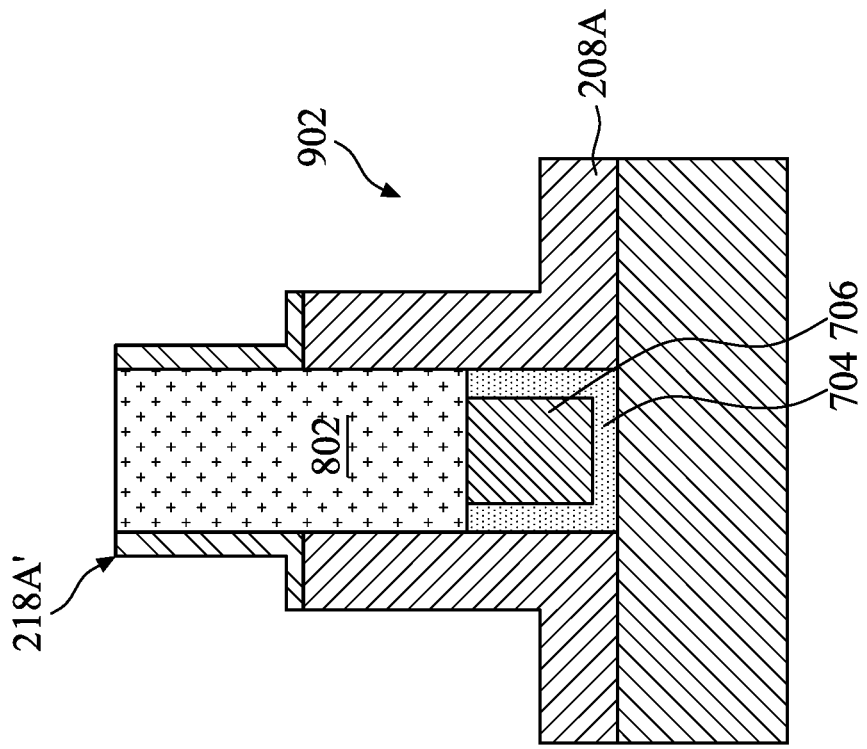
Figure 12A:
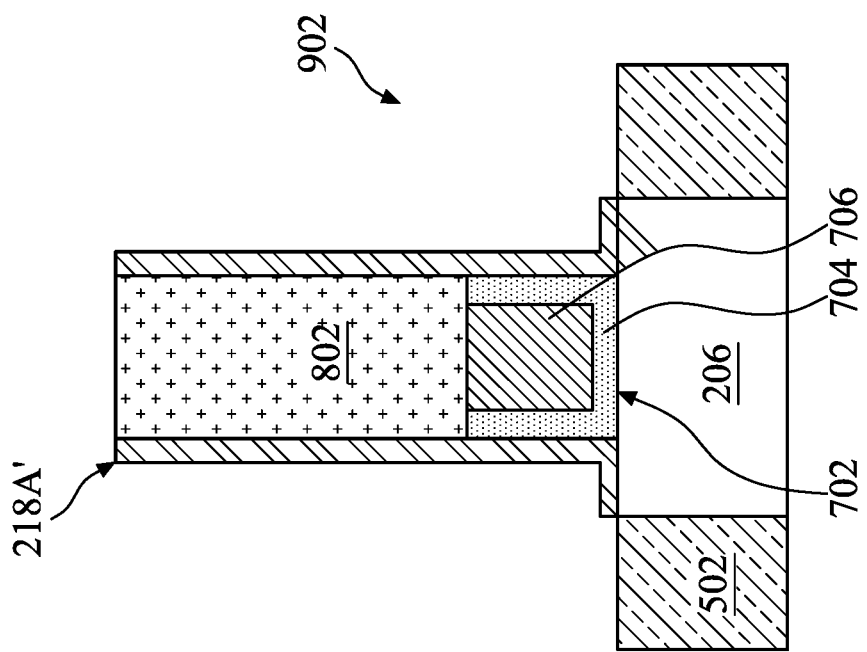

In some implementations, block 118 of the method 100 further includes decreasing a thickness of a remaining spacer layer, exemplified by spacer layer 218A. FIGS. 12A and 12B illustrate a reduced thickness spacer 218A'. In an embodiment, the etching process reduces the thickness of the spacer layer 218A between approximately 10% and 90%. While a greater reduction in thickness benefits the formation of a larger opening 902, if insufficient spacer material remains there may be risks to the protection the sidewalls of the gate structure 702. In some implementations, the reduction in thickness of spacer layer 218A is performed after and separate from the removal of spacer layer 218B. In other implementations, the reduction of thickness of spacer layer 218A is performed in a single etching process with the removal of the spacer layer 218B. The etching process may include dry etch such as a reactive ion etch or other plasma assisted etching process, a wet etch, or other suitable etching processes. In some embodiments, approximately 1-10 nanometers of the spacer layer 218A' remain on the sidewall of the gate structure 702.

Figure 13B:
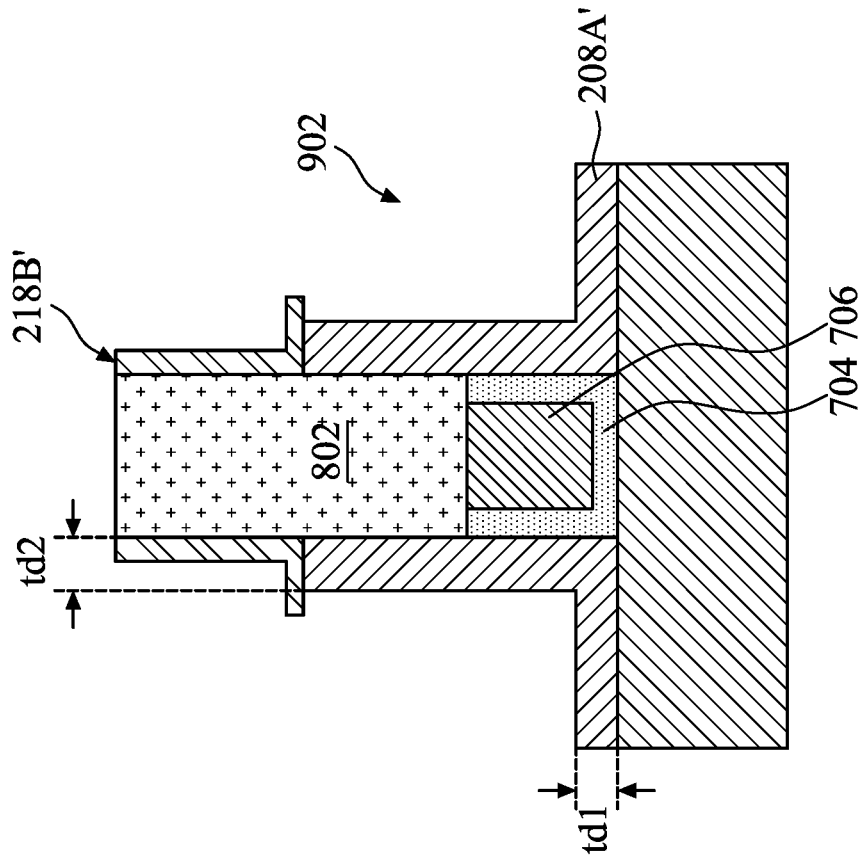
Figure 13A:
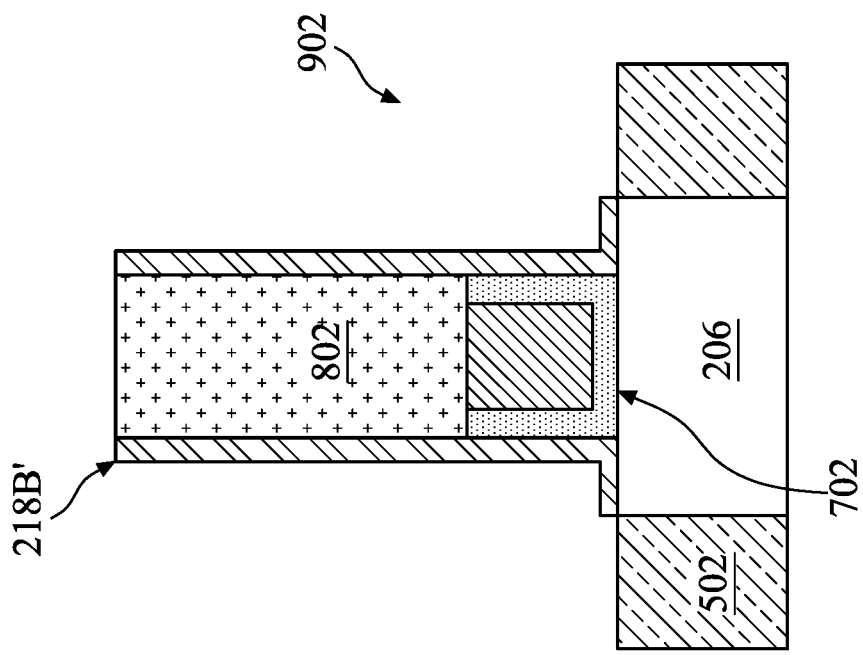

The method 100 then proceeds to block 120 where the dielectric layer (e.g., high-k dielectric layer) of the hybrid fin is pulled back. In an embodiment, the dielectric layer is a high-k dielectric layer and an etchant selective to the high-k dielectric layer is utilized to reduce the thickness of the dielectric layer. Referring to the example of FIG. 13B, the dielectric layer 208A has been etched back to form reduced thickness dielectric layer 208A'. In some embodiments, a masking element overlays the active fin 206 region during the etch back of the dielectric layer 208A. Thus, FIG. 13A illustrates a substantially similar structure to that of FIG. 12A. In some implementations, the reduction in thickness of the dielectric layer 208A is performed separately from the formation of the spacer layer 218A'. In some implementations, the reduction in thicknesses are performed in situ. The etching process may include suitable dry or wet etching processes.

In an embodiment, the etching process reduces the thickness of dielectric layer 208A between approximately 10% and 100% (e.g., full removal). In some embodiments, a thickness of td1 remains at the bottom of the layer 208A' and a thickness td2 remains at the top of the layer 208A'. Thickness td1 and td2 may differ. Exemplary thicknesses for td1 and/or td2 include approximately 0.5 nm-10 nm. In some implementations, the entire dielectric layer 208A is removed. In embodiments where a layer 208A' remains, the layer may be L-shaped adjacent the gate structure 702 and extend contiguously to the adjacent gate structure (see FIG. 2). Therefore, in some implementations the layer 208A' can be U-shaped between adjacent gate structures. As illustrated in FIG. 13B, a horizontal extending portion of the spacer layer 218B' may extend beyond an edge of the dielectric layer 208A' forming a non-collinear, stepped-structure edge.

Having formed an expanded opening adjacent the gate structures through the preceding blocks of the method 100, the method 100 then proceeds to block 122 where secondary spacers are formed within the expanded opening. The secondary spacers may include a secondary spacer and a sacrificial secondary spacer. In some implementations, the sacrificial secondary spacer is a sacrificial or dummy spacer that defines a region for an air gap as discussed below.

Figure 14B:
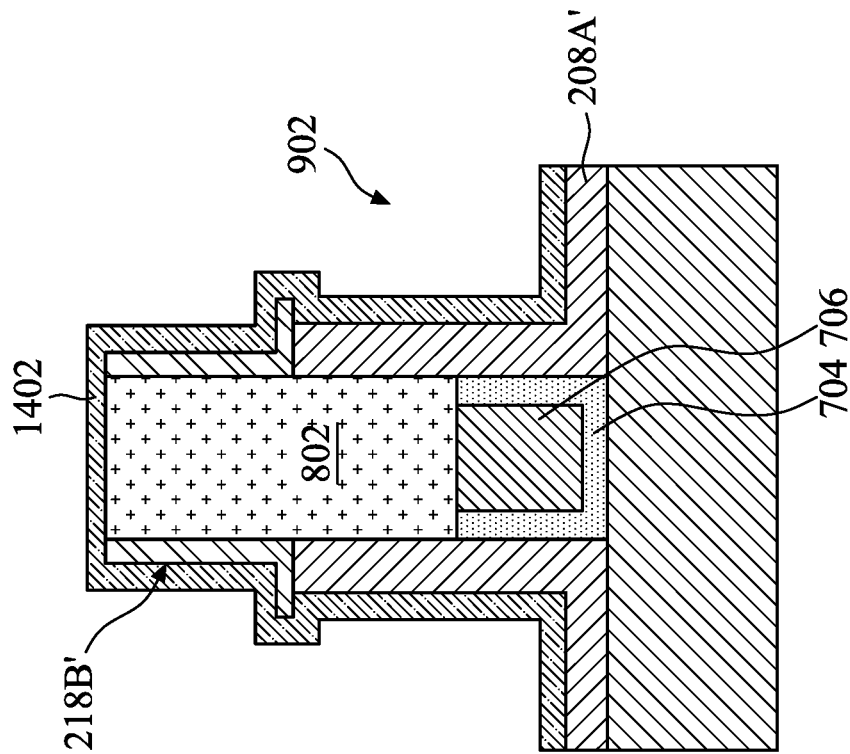
Figure 14A:
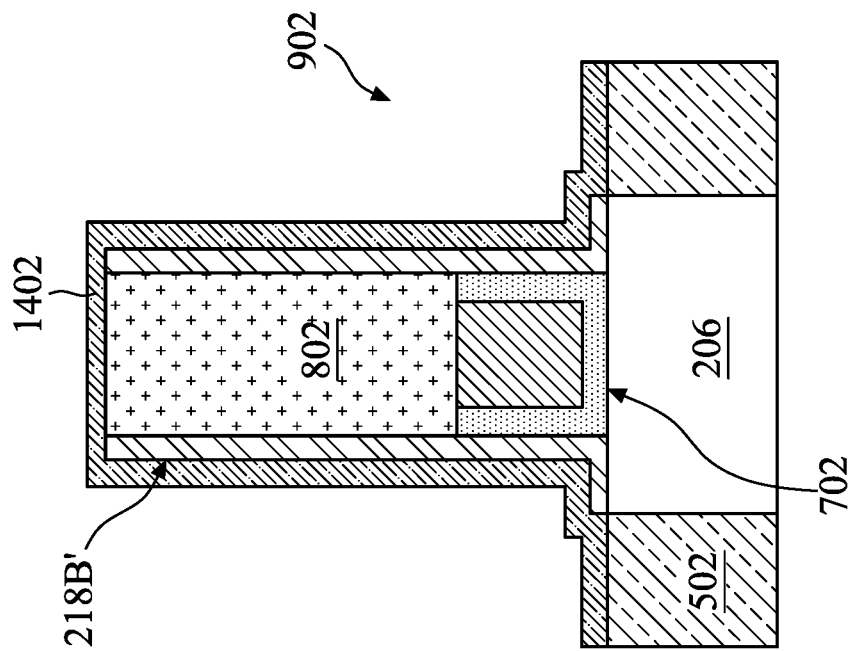

Referring to the example of FIGS. 14A and 14B, a secondary spacer material layer 1402 is formed over the structure. The secondary spacer material layer 1402 may be formed by CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), oxidation, other suitable methods, or combinations thereof. In an embodiment, the secondary spacer material layer 1402 is deposited as a conformal layer. Exemplary compositions of the secondary spacer material layer 1402 include SiN, HfSi, AlON, HfO, LaO, AlO, LaO, ZrN, SiC, ZnO, SiOC, SiOCN, YO, TaCN, ZrSi, SiCN, ZrAlO, TiO, TaO, ZrO, combinations thereof, and/or other suitable materials. The secondary spacer material layer 1402 may have a thickness of between approximately 1 nm-10 nm. The secondary spacer material layer 1402 thickness impacts the capacitance between the gate structure 702 and the subsequently formed contact structure and thus, its thickness may be selected to account for the desired capacitance while also protecting underlying features (e.g., epitaxial feature 502).

Figure 15B:
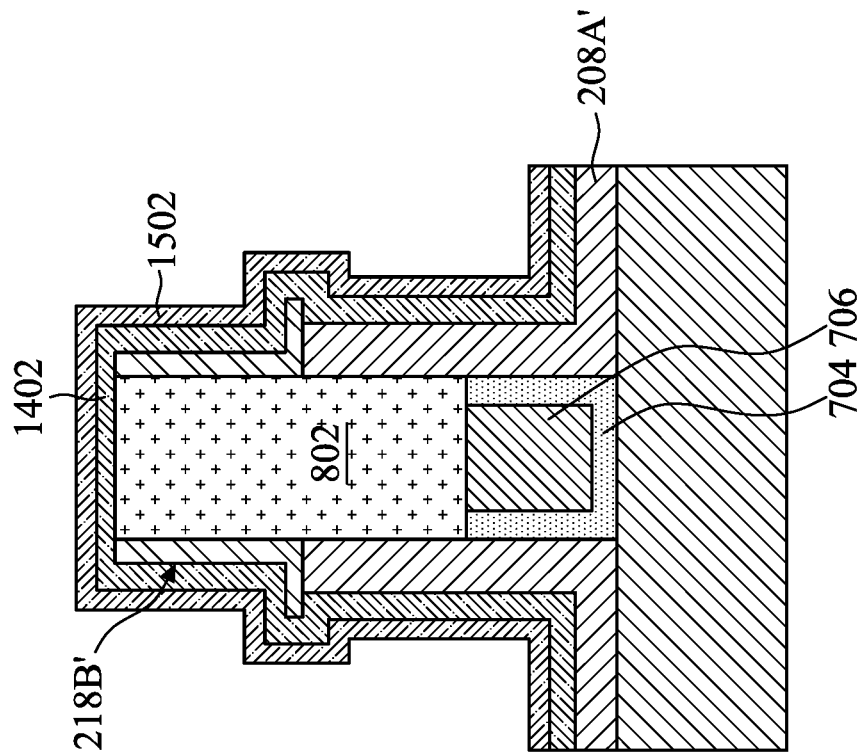
Figure 15A:
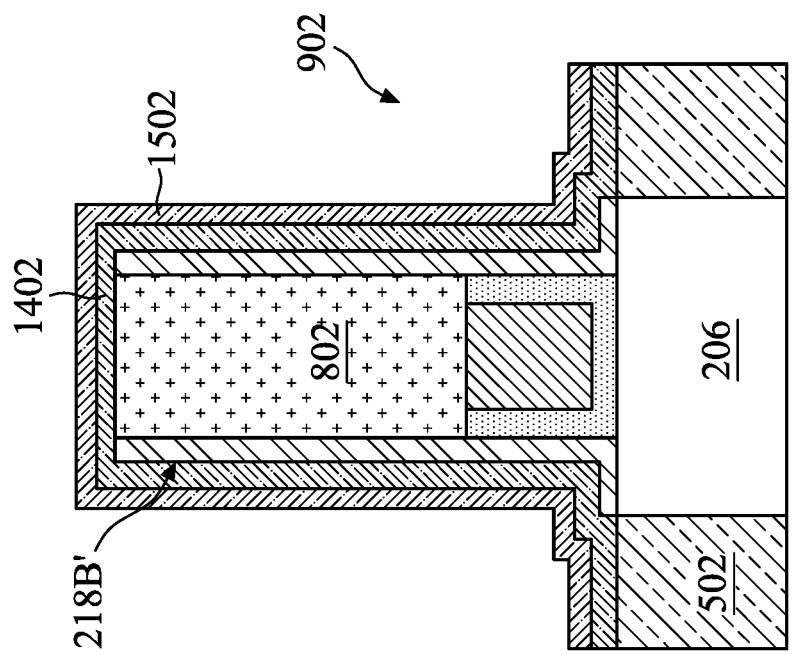

Referring to the example of FIGS. 15A and 15B, a secondary sacrificial spacer layer 1502 is formed over the structure. The secondary sacrificial spacer layer 1502 may subsequently form a dummy spacer that is removed to provide an air gap as discussed below. The secondary sacrificial spacer layer 1502 may be deposited by CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. In an embodiment, the secondary sacrificial spacer layer 1502 is deposited as a conformal layer. Exemplary compositions of the secondary sacrificial spacer layer 1502 include silicon, a-silicon, or other suitable compositions. Exemplary thicknesses of the secondary sacrificial spacer layer 1502 include approximately 1 nm to approximately 10 nm. As the thickness of the secondary sacrificial spacer layer 1502 defines the region of the air gap, and thus the low-k dielectric region, a greater thickness of the secondary sacrificial spacer layer 1502 provides for a lower capacitance between the gate structure 702 and an adjacent feature, such as the contact structure discussed below. However, the thickness of secondary sacrificial spacer layer can be controlled to avoid impacting the pitch of the devices.

Figure 16B:
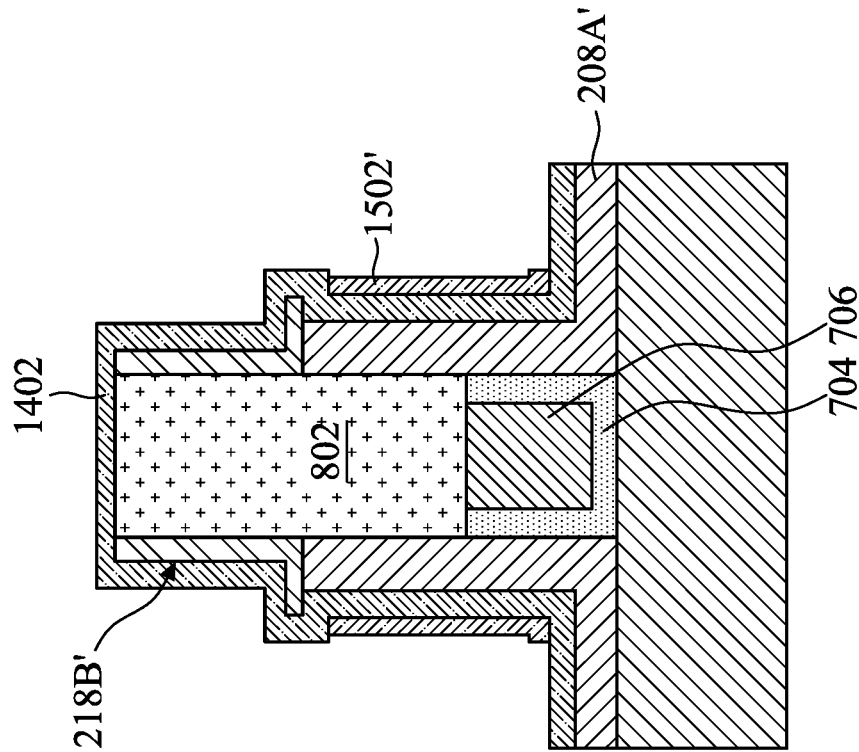
Figure 16A:
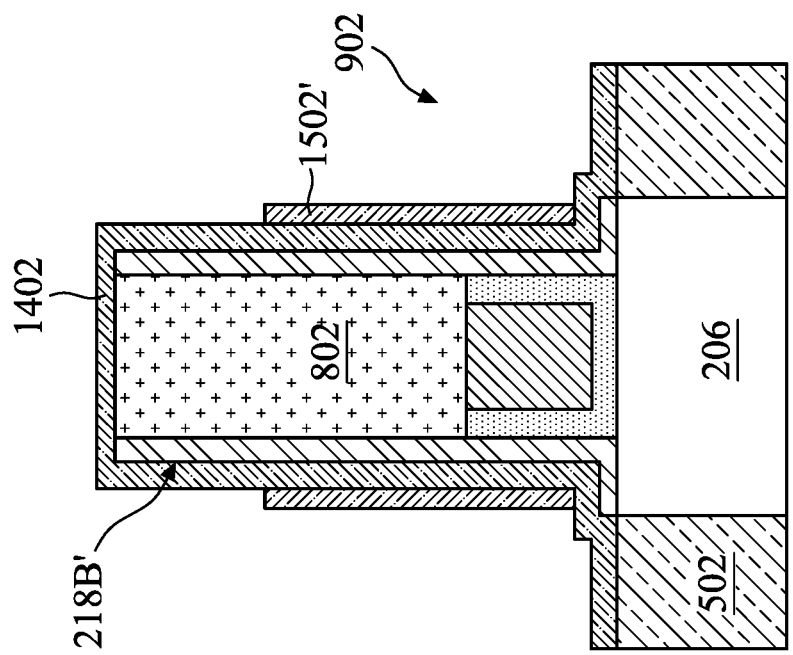
Figure 17B:
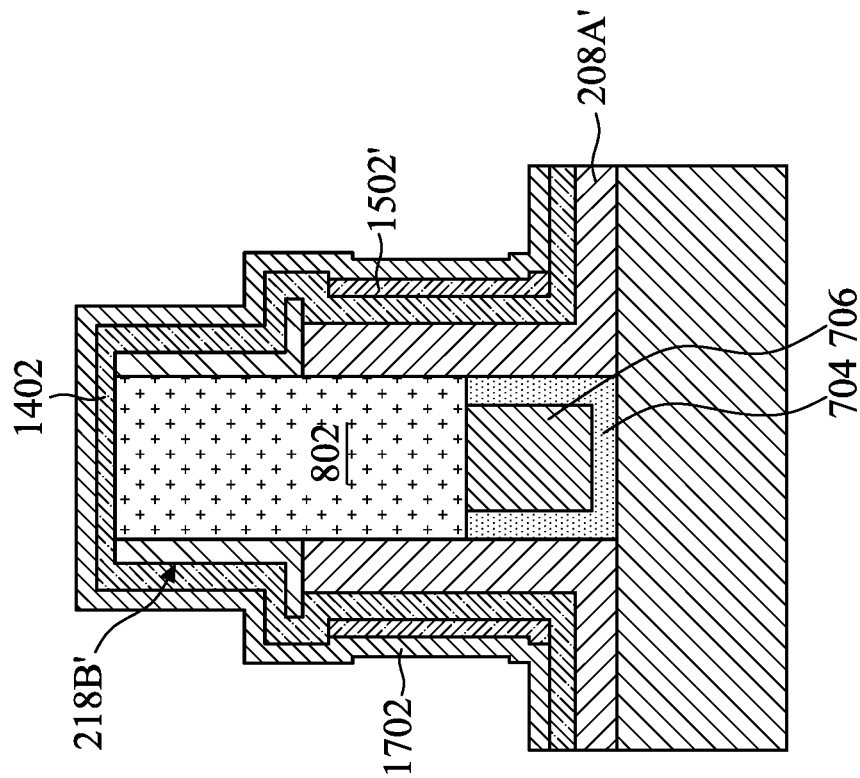
Figure 17A:
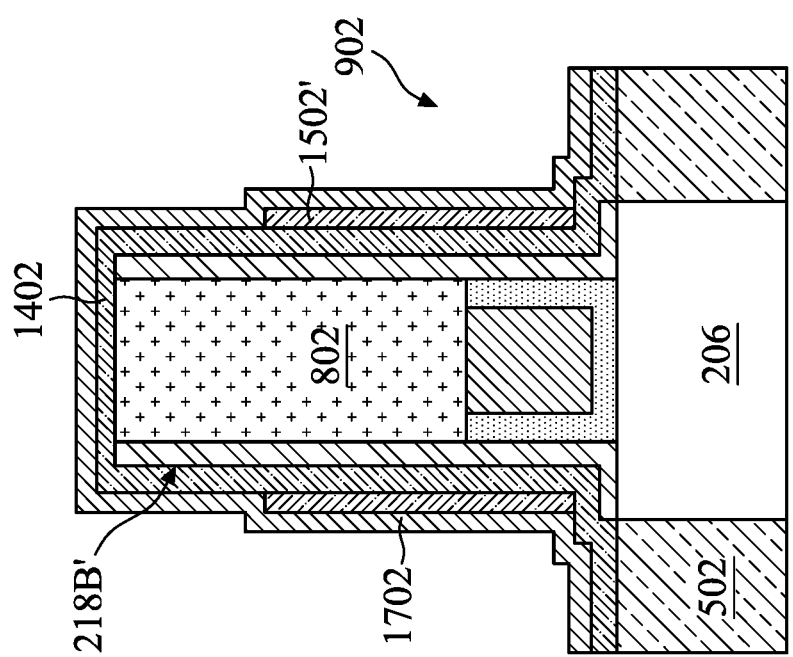
Figures 19A, 19B:
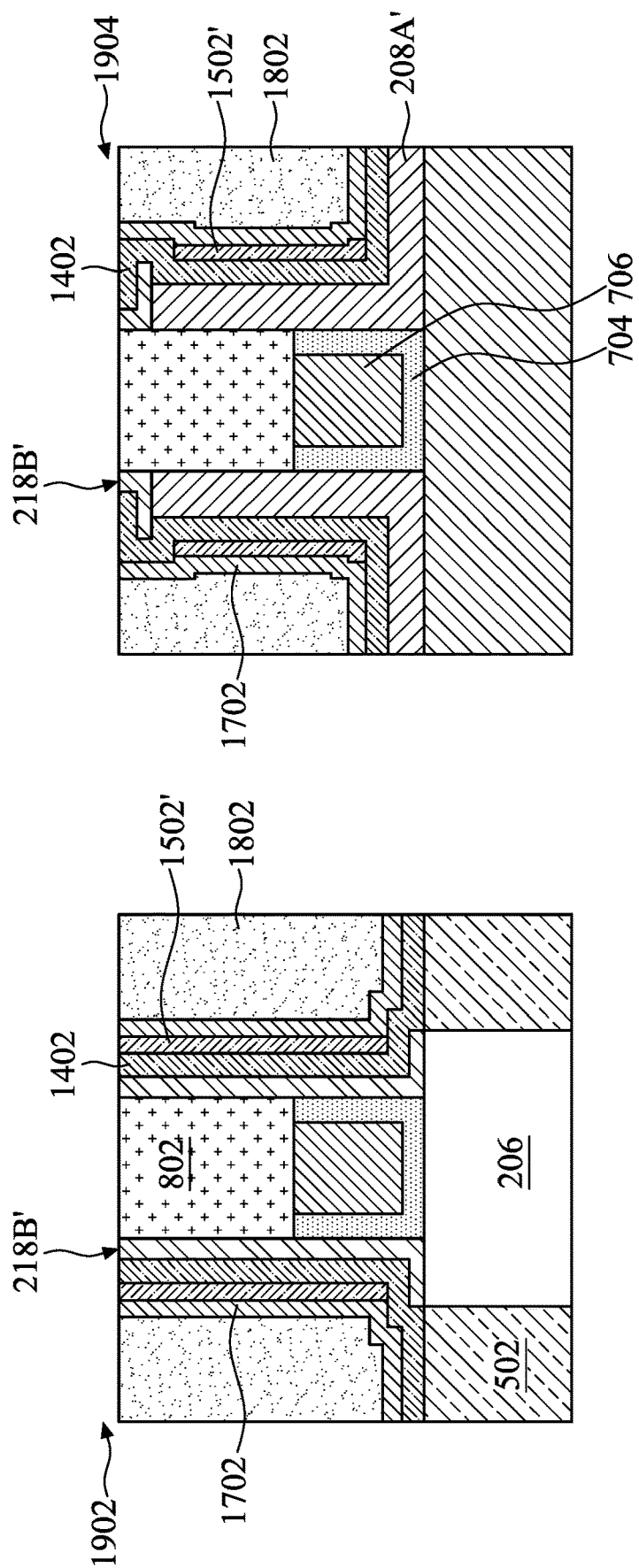

In some implementations, after deposition of the secondary sacrificial spacer layer, the sacrificial material (e.g., conformal layer) is etched back to remove the secondary sacrificial spacer layer from over the gate structures and form dummy spacer elements on the gate sidewalls. Referring to the example of FIGS. 16A and 16B, the secondary sacrificial spacer layer 1502 is etched back to form dummy spacer elements 1502'. The etching may include suitable etching processes such as an anisotropic etch. The dummy spacer elements 1502' extend above the height of the gate electrode 706. In some implementations, as illustrated in FIG. 16B, the dummy spacer elements 1502' include a foot portion, or are L-shaped in their configuration due to the directional etchings and the overhang of the spacers 218' and thus, the secondary spacer layer 1402.

The method 100 then proceeds to block 124 where a contact etch stop layer (CESL) is formed on the structure. The CESL may be substantially similar to as discussed above with reference to block 110. Referring to the example of FIGS. 17A and 17B, a CESL 1702 is formed over the structures on the fin 206 and the hybrid fin 208. The CESL 1702 may be formed by CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. Exemplary compositions of the CESL 1702 include SiN, HfSi, AlON, HfO, LaO, AlO, LaO, ZrN, SiC, ZnO, SiOC, SiOCN, YO, TaCN, ZrSi, SiCN, ZrAlO, TiO, TaO, ZrO, combinations thereof, and/or other suitable materials. The CESL 1702 may have a thickness of between approximately 1 nm and 10 nm. The thickness may be selected to provide suitable etch stop properties, while considering the impacts to the capacitance between the gate structure 706 and the adjacent contact discussed below. The CESL 1702 may be substantially the same thickness over the fin 206 and the hybrid fin 208, for example, deposited as a conformal layer.

The method 100 then proceeds to block 126 where an ILD layer is formed over the structure. The ILD layer may be substantially similar to as discussed above with reference to block 110. Referring to the example of FIGS. 18A and 18B, an ILD 1802 is formed over the structure. The ILD 1802 may be deposited by deposition processes (such as CVD, PVD, ALD, HDPCVD, MOCVD, RPCVD, PECVD, LPCVD, ALCVD, APCVD, FCVD, HARP, HDP, other suitable methods, or combinations thereof). Exemplary compositions of the ILD 1802 include a dielectric material having a dielectric constant that is less than about 2.5 (e.g., ELK), silicon carbide (SiC), carbon-doped oxide (for example, a SiCOH-based material (having, for example, Si—CH3 bonds)), silicon nitride, silicon oxynitride, and/or other suitable compositions. The ILD layer 1802 may fill the region between adjacent gate structures.

Block 126 of the method 100 in some implementations may include a planarization process, such as a chemical mechanical polish, of the structure after the ILD deposition. Referring to the example of FIGS. 19A and 19B, the structures have been planarized to expose a top surface of the SAC 802 and provide planar surfaces 1902 and 1904 respectively. The planar surface 1902 is defined by the SAC 802, the spacer 218A', the first spacer 1402, the dummy spacer element 1502', the CESL 1702, and the ILD 1802. The planar surface 1904 is defined by the SAC 802, the spacer 218A', the first spacer 1402, the CESL 1702, and the ILD 1802.

The method 100 then proceeds to block 128 where a contact structure is formed adjacent the gate structures. The contact structure may be formed to interface and provide a connection to the source/drain feature of the active area. Referring to the example of FIGS. 20A and 20B, a contact feature 2002 is formed to the source/drain region 502 over the fin 206. Similar in structure, the contact feature 2002 is formed adjacent the gate structure 702 over the hybrid fin 208. Here, the contact structure may interface the dielectric layer 208A, for example, high-k dielectric. In some implementations, the contact structure 2002 over the hybrid fin 208 does not provide for conducting an electrical signal to a feature on the hybrid fin 208, but is a dummy structure.

The contact structure 2002 may include one or more electrically conductive materials, such as tungsten, ruthenium, cobalt, copper, aluminum, iridium, palladium, platinum, nickel, other low resistivity metal constituent, alloys thereof, silicide, or combinations thereof. The conductive material(s) can be deposited by PVD, CVD, ALD, electroplating, electroless plating, other suitable deposition process, or combinations thereof. The contacts 2002 may include a multi-layer structure such as a barrier layer, adhesion layer, bulk layer, and/or other suitable layers.

Figures 20A, 20B:
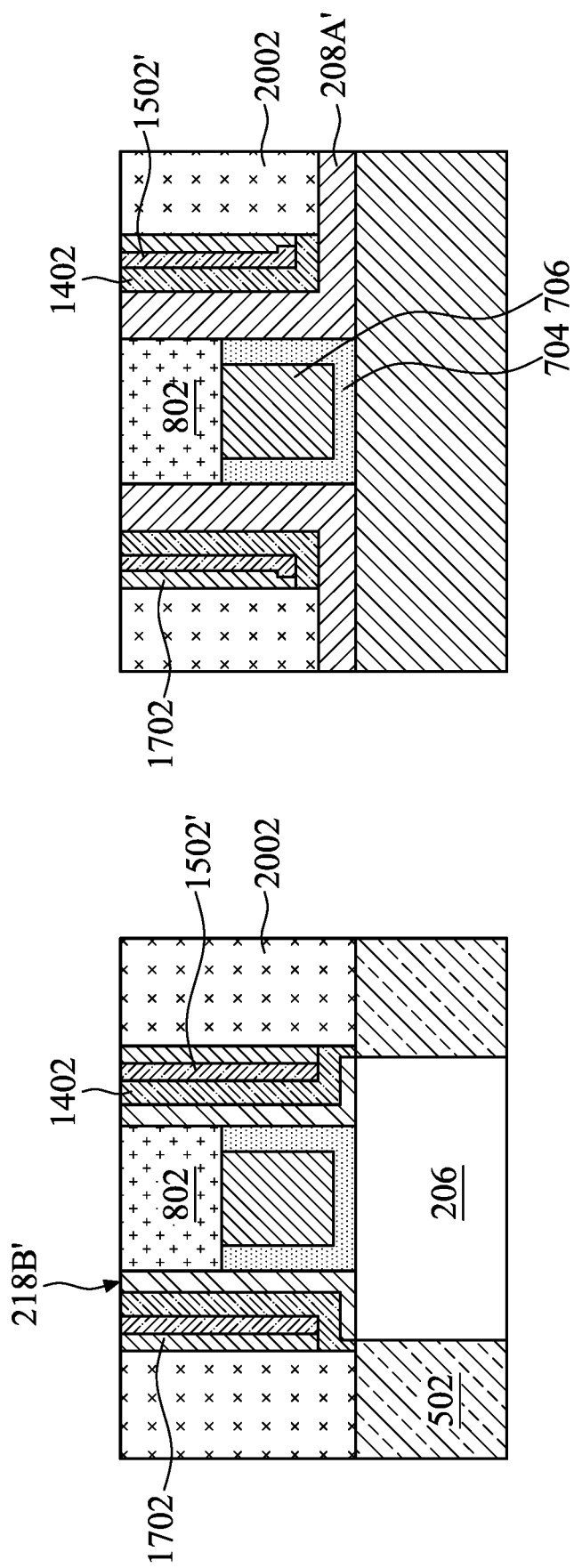
Figure 21A:
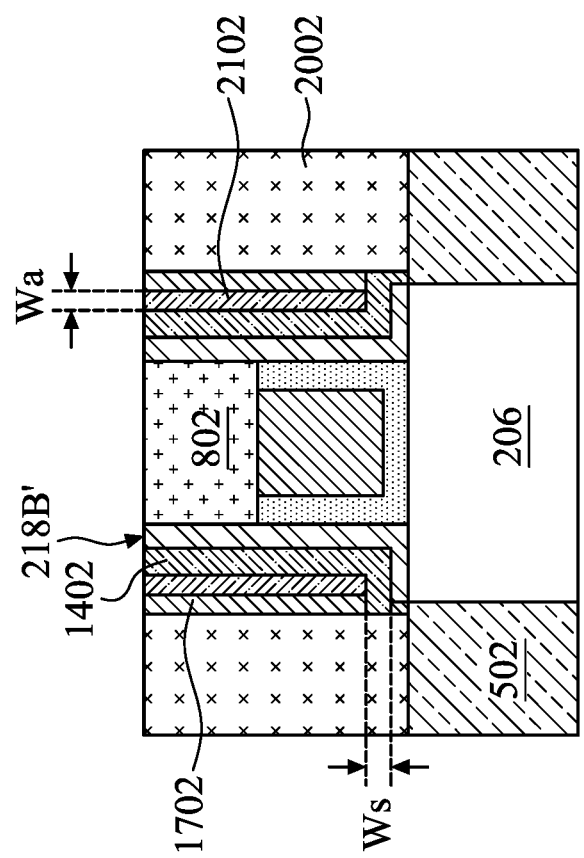
Figure 21B:
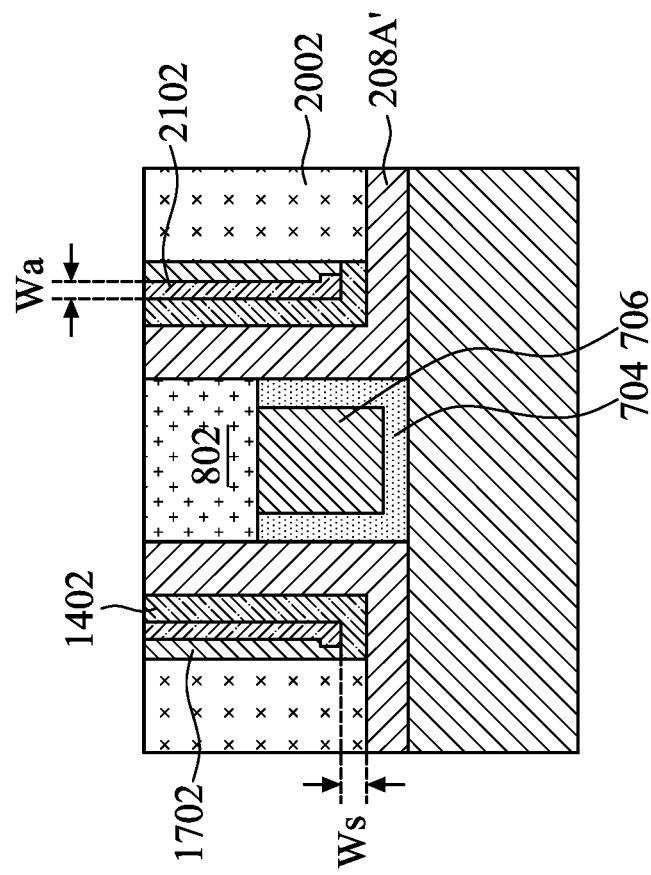
Figure 22B:
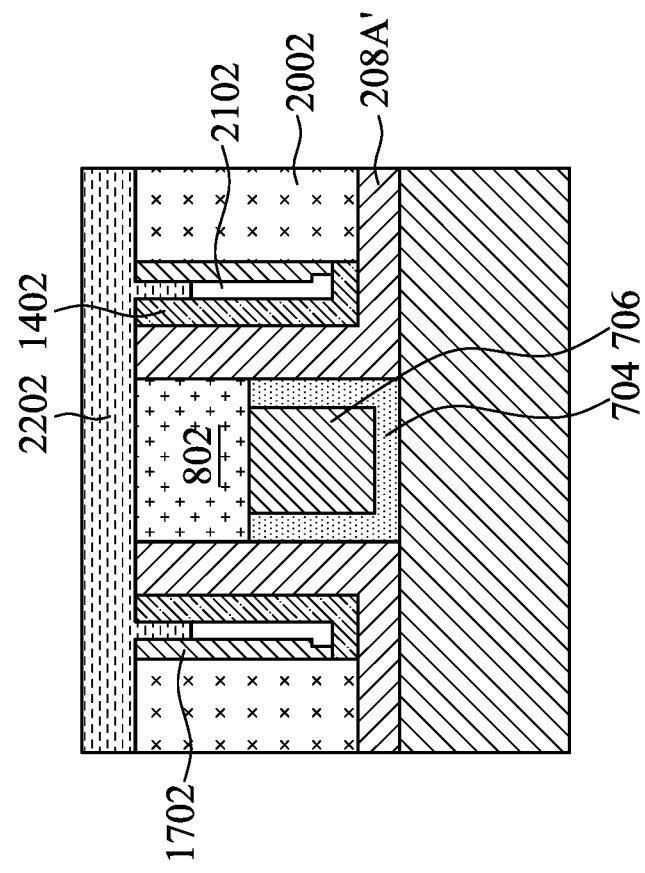
Figure 22A:
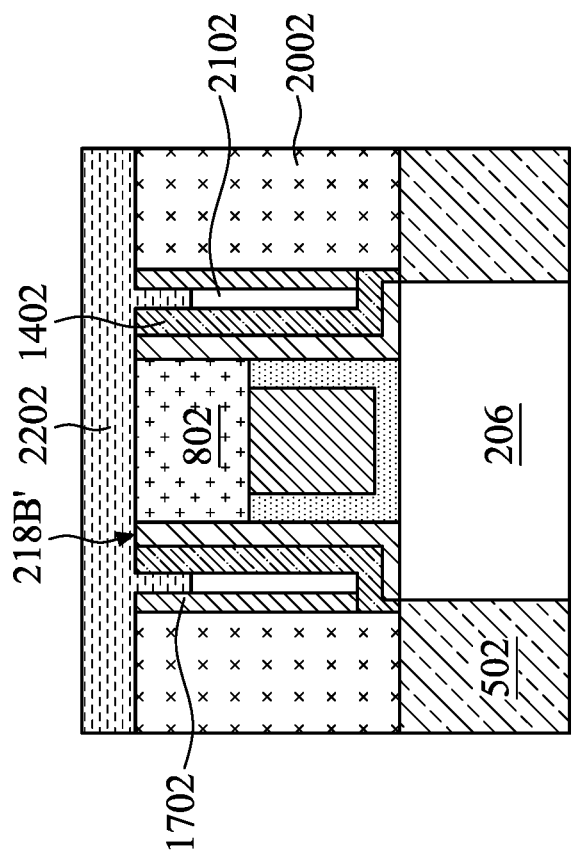

After formation of the contact structure 2002, the structure may be further planarized for example by a chemical mechanical polish. In some implementations, the planarization exposes the dummy spacer 1502' including over the hybrid fin 208 as shown in FIG. 20B.

The method 100 then proceeds to block 130 where the dummy spacer element is selectively removed to form an air gap. The dummy spacer is removed over both the active fin and the hybrid fin, in some implementations, concurrently. Referring to the example of FIGS. 21A and 21B, the dummy spacer 1502' is removed to form air gap 2102. It is noted that while the illustration shows the entire removal of the dummy spacer 1502', in some implementations, a residue of spacer material remains for example at a bottom of the air gap 2102. The removal of the dummy spacer 1502' may be performed by suitable selective etching process such as a dry etch or wet etch process.

The air gap 2102 may have a width, $w_a$, of between approximately 1 nanometer and approximately 10 nanometers. The width $w_a$ of the air gap 2102 affects the capacitance between the gate structure and the subsequently formed contact feature and thus, the greater the width, the larger the low-k dielectric region thereby providing for further capacitance improvement. Should the thickness become too great however, the pitch and structural integrity may be impacted. The secondary spacer layer 1402 may have a thickness ws under the air gap 2102 of between approximately 1 nm and approximately 10 nm. In some implementations, the thickness of the secondary spacer 1402 at the sidewall may also be between 1 and 10 nm. The thickness of the secondary spacer 1402 may be selected to provide suitable protection for underlying features, while limiting its impact on the capacitance performance improvements gained by the air gap 2102. In an embodiment, the air gap 2102 over the hybrid fin 208 includes a foot portion, or is L-shaped in configuration. The foot portion may have a thickness (i.e., vertically measured) substantially similar to the thickness of the air gap 2102 along the sidewall (i.e., horizontally measured).

Figures 23A, 23B:
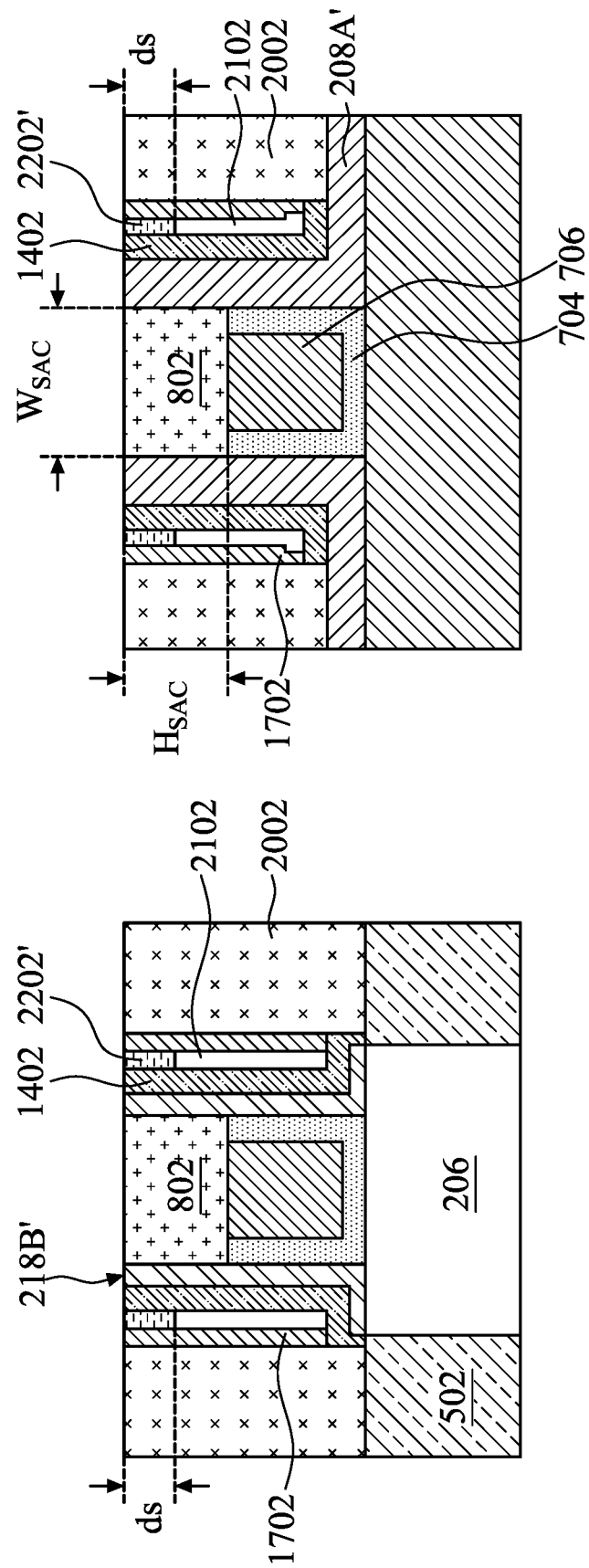
Figures 24A, 24B:
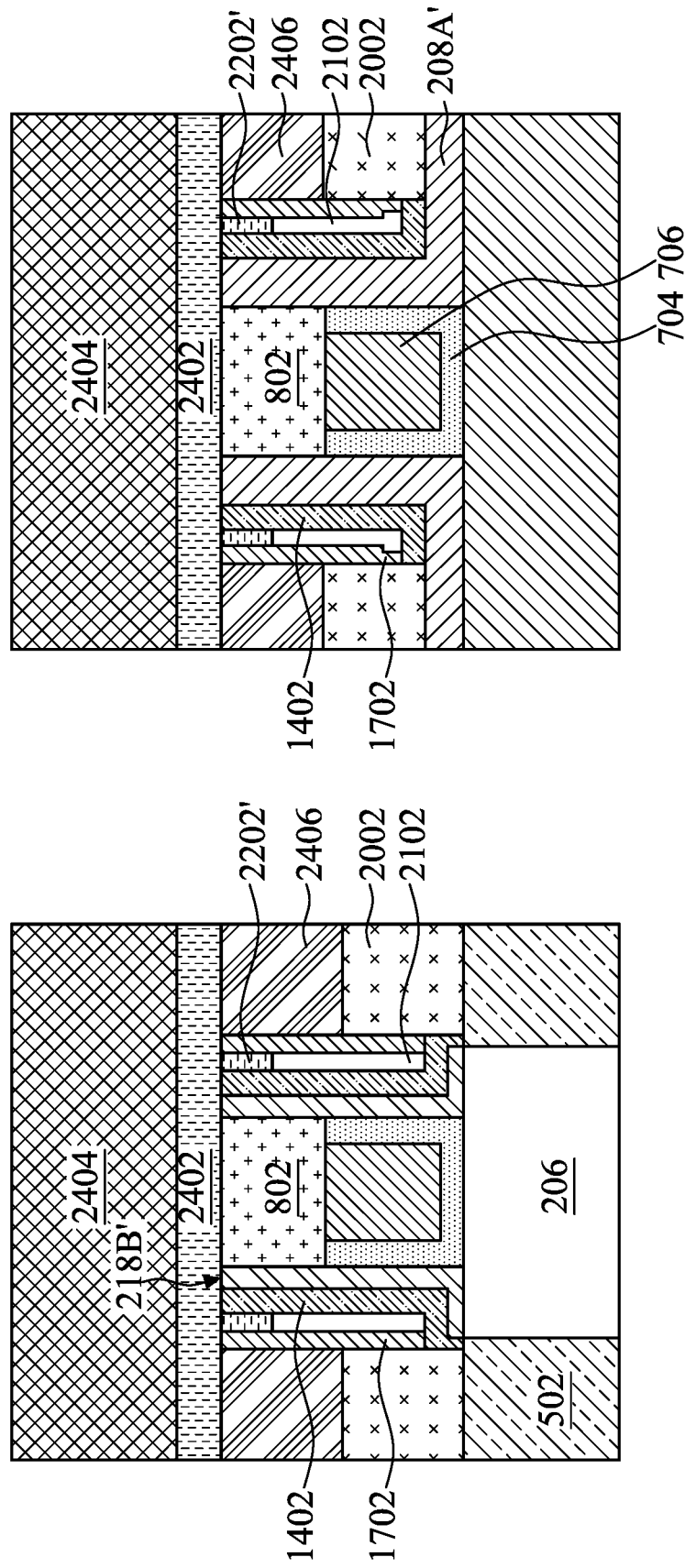

The method 100 then proceeds to block 132 where a seal layer is formed over the air gap of block 130. Referring to the example of FIGS. 22A and 22B, a seal material layer 2202 is deposited over the structure. The seal material layer 2202 may be deposited by CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. Exemplary compositions of the seal layer include SiN, HfSi, AlON, HfO, LaO, AlO, LaO, ZrN, SiC, ZnO, SiOC, SiOCN, YO, TaCN, ZrSi, SiCN, ZrAlO, TiO, TaO, ZrO, combinations thereof, and/or other suitable compositions. After deposition of the seal material layer 2202, an etching back or planarization process may be performed to remove the overfill of the seal material layer 2202 and provide seal features 2202' as illustrated in FIGS. 23A and 23B. In some implementations, the depth of the seal feature 2202', denoted $d_s$, is between approximately 1 nm and approximately 10 nm. The seal features 2202' may be of sufficient thickness to protect the air gap 2102 during the deposition of overlying layer, but thin enough to allow for the air gap 2102 to extend along the length of the gate electrode 706.

In some implementations at this point in the fabrication process and/or in the final device, the SAC 802 has been processed to provide a thickness of HSAC between approximately 1 nanometer and 30 nanometers. In other implementations, and/or at other portions of the structure, the SAC 802 has been eliminated. In some, the SAC 802 has a width of wsAc between approximately 2 nanometers and 50 nanometers. In other implementations, and/or at other portions of the structure, the SAC 802 has been eliminated. $w_{SAC}$ and $H_{SAC}$ may be substantially similar between the structure over the fin 206 and the structure over the hybrid fin 208. The dimensions of the SAC 802 may be selected to provide suitable protection of the gate electrode 706, isolation between adjacent conductive features (e.g., gate structures), and/or provide surrounding insulating material for a subsequently formed gate contact structure which extends therethrough.

The structures of FIGS. 23A and 23B are illustrative of the air gap 2102 interposing the gate electrode 706 and the contact 2002, two conductive structures. The air gap 2102 provides air, a low dielectric constant medium (air having a k-value of approximately 1) interposing the features. The low dielectric constant allows for a reduction of capacitance between the two features, in comparison with a high-k dielectric material. Thus, the method 100 provision of a reduction of the amount of high-k material of the hybrid fin 208A (e.g., exemplified by the etch back step above and/or the air gap 2102) and the method 100's introduction of a low-k medium of air can provide for device performance improvement. Specifically, the method 100 and device 200 in some implementations allows for lowering the coupling capacitance between the two conductive features in comparison with, for example, additional high-k material of the hybrid fin 208A interposing said features. Lowering the capacitance provides for device performance enhancement including providing a higher operating speed device.

The method 100 may proceed to block 134 where fabrication continues including forming additional layers of the MLI over the gate structure and contact features of the structure. Referring to the example of FIGS. 24A and 24B, in some implementations, the contact 2002 is recessed and a second capping layer SAC 2406 is disposed over the contact 2002. The SAC 2406 may include SiN, HfSi, AlON, HfO, LaO, AlO, LaO, ZrN, SiC, ZnO, SiOC, SiOCN, YO, TaCN, ZrSi, SiCN, ZrAlO, TiO, TaO, ZrO, combinations thereof, and/or other suitable materials. The thickness of the SAC 2406 may be between approximately 1 and 50 nm. The thickness of the SAC 2406 provides for isolation region within which an interconnect can be formed and determines the contact resistance of the feature 2002. In other embodiments, the SAC 2406 is omitted. The SAC 2406 may be substantially similar as disposed over the hybrid fin 208 and as disposed over the fin 206.

Figures 25A, 25B:
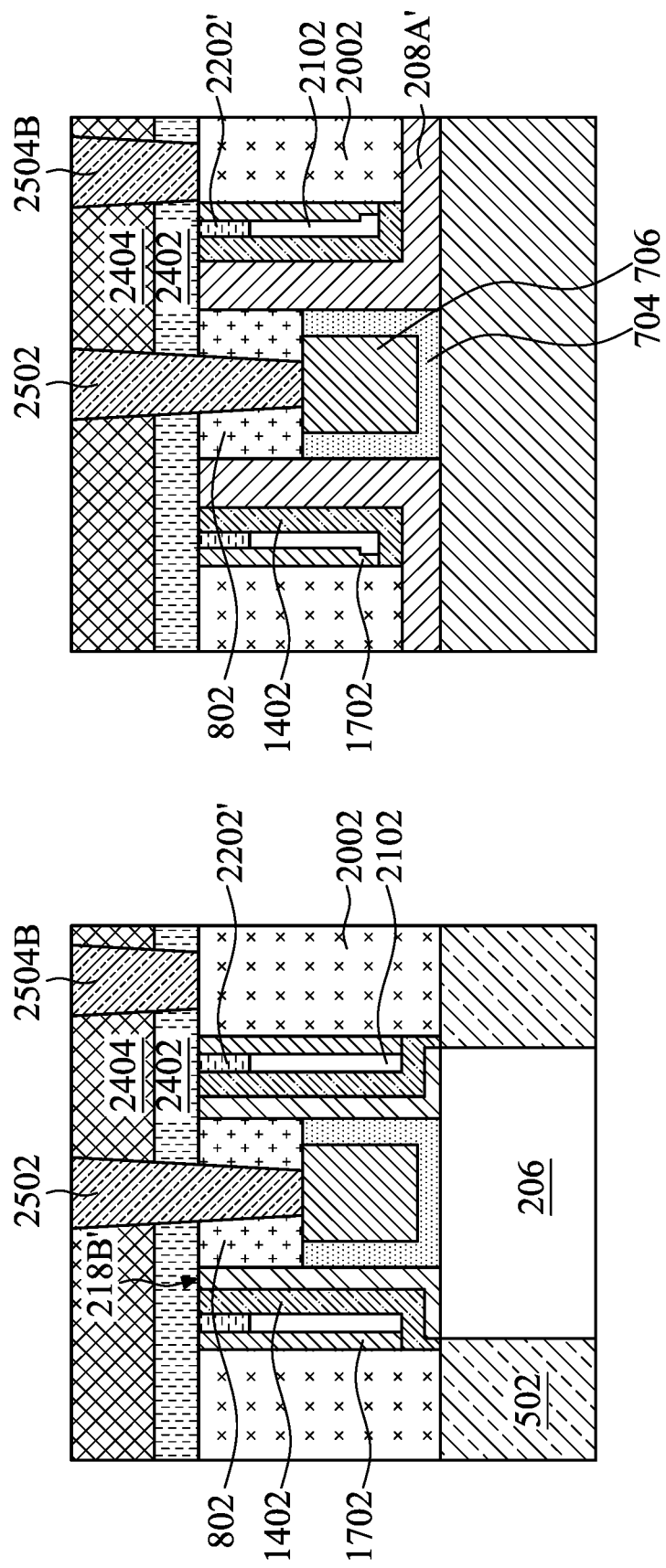

In some implementations of the method 100, an etch stop layer (ESL) 2402 and/or an ILD layer 2404 may be disposed over the structure. The ESL 2402 and/or ILD layer 2404 may form a portion of an MLI of the device 200. The ESL 2402 may include a different material than the ILD layer 2404. In some implementations, the ESL 2402 includes silicon nitride, silicon oxide, silicon oxynitride, silicon carbide or other suitable material that functions to stop the etching of the subsequent etching process(es). The ILD layer 2404 may be substantially similar to the ILD layers 606 and/or 1802 discussed above. The method may continue to form conductive interconnect features of the MLI extending through the ESL 2402 and ILD layer 2404 to the contact features 2002. Exemplary interconnect features of a conductive via 2502 providing an interconnection to the gate structure 702 and a conductive via 2504 providing an interconnection to the contact feature 2002 are illustrated in FIGS. 25A and 25B. Again, it is noted that the interconnect features interfacing the hybrid fin features may be dummy features such that they do not carry a current to an active device on the hybrid fin. These features over the hybrid fin may be provided nonetheless for process uniformity and avoidance of loading effects (e.g., lithography, etching).

The conductive vias 2502 and 2504 may be filled with one or more electrically conductive materials, such as tungsten, ruthenium, cobalt, copper, aluminum, iridium, palladium, platinum, nickel, other low resistivity metal constituent, alloys thereof, or combinations thereof. The conductive material(s) can be deposited by PVD, CVD, ALD, electroplating, electroless plating, other suitable deposition process, or combinations thereof. After deposition, a planarization process may remove excess conductive material. The conductive vias 2502 and 2504 may include a multi-layer structure such as a barrier layer, adhesion layer, bulk layer, and/or other suitable layers.

FIGS. 26A and 26B illustrate an alternative embodiment of a device 200'. While substantially similar to the device 200 illustrated in the previous figures and similarly fabricated according to the steps of the method 100 as discussed above, the device 200' illustrates that in some implementation in forming the contact structures 2002, a portion of the ILD layer 1802' may remain between the contact structure 2002 and the CESL 1702. The residual ILD layer 1802' may be provided on side of the gate structure 702 and removed from an opposing side as illustrated, or may be present on both sides of the gate structure 702. Similarly, the residual ILD layer 1802' may be present over the hybrid fin 208 and removed over the fin 206, or vice versa.

FIGS. 27A and 27B illustrate an alternative embodiment of the device 200". While substantially similar to the device 200 illustrated in the previous figures and similarly fabricated according to the method 100 discussed above, the device 200" illustrates that in some implementations, a residual portion of the dummy spacer element 1502" may remain, for example over the hybrid fin 208. The residual portion 1502" may interface the first spacer 1402, the CESL 1702, and/or the air gap 2102. In some implementations, the residual portion 1502" causes the shape of the air gap 2102 to not include a foot or L-shaped configuration, but be substantially rectangular in shape.

The device 200" also is illustrative of an offset conductive via 2504'. The offset conductive via 2504' may be misaligned due to processing tolerances, design choices, and/or other recognized or unrecognized causes. The offset conductive via 2504' may interface a top portion of the CESL 1702 and/or the seal 2202'.

Thus, in some of the embodiments provided herein, an air gap provides a region of a low-k dielectric interposing conductive features that may reduce the capacitance of the device. In particular, in some embodiments, the air gap region is provided in lieu of some or all of the high-k dielectric material of a hybrid fin. In some implementations, the air gap region is provided over the hybrid fin and between features formed on the hybrid fin.

Thus, one of the embodiments of the present disclosure described is a method that includes forming a fin structure and a hybrid fin structure over a substrate. The hybrid fin structure comprises a dielectric material. A gate structure is formed over the fin structure and the hybrid fin structure. A dummy spacer feature is provided adjacent the gate structure and over the hybrid fin structure. A contact element is provided over the hybrid fin structure. The dummy spacer feature interposes the gate structure and the contact element. The method includes removing the dummy spacer feature to form an air gap.

In an embodiment, the method further includes forming a first spacer between the dummy spacer feature and the gate structure over the hybrid fin structure. In an implementation, after providing the dummy spacer feature and prior to providing the contact element, a contact etch stop layer is deposited over the dummy spacer feature. In some implementations of the method, forming the hybrid fin structure includes forming a fin structure having a bottom layer and a top layer. The top layer may be a high-k dielectric material. In a further embodiment, a dummy gate structure is formed over the top layer of the hybrid fin structure. A region of the high-k dielectric material of the hybrid fin structure adjacent the dummy gate structure is etched and after the etching, the dummy gate structure is removed and the gate structure is provided. In an embodiment, removing the dummy gate structure includes etching the top layer of the hybrid fin structure to expose the bottom layer of the hybrid fin structure. In a further embodiment, the top layer of the hybrid fin structure is thinned after the removing the dummy gate structure and after the region of the high-k dielectric adjacent the dummy gate structure is etched. In an embodiment, removing the dummy spacer feature to form the air gap forms a first air gap over the hybrid fin structure and a second air gap over the fin structure. In a further embodiment, a seal layer is formed over the air gap.

In another of the broader embodiments of the method, the method includes forming an active fin structure and a dielectric fin structure over a substrate. The dielectric fin structure comprises a layer of high-k dielectric material. The method may further include providing a first dummy gate structure over the active fin structure and a second dummy gate structure over the layer of high-k dielectric material of the dielectric fin structure. Source/drain regions of the active fin structure and the dielectric fin structure adjacent the first and second dummy gate structures respectively are recessed. The method proceeds to include removing the first dummy gate structure to expose a channel region of the active fin structure and removing the second dummy gate structure. Removing the second dummy gate structure etches an opening in the layer of high-k dielectric material. A first metal gate structure is formed over the channel region of the active fin structure and forming a second metal gate structure within the opening in the layer of high-k dielectric material. After forming the second metal gate structure, the method may include reducing a thickness of the layer of high-k dielectric material adjacent the second metal gate structure. A conductive contact is formed over the dielectric fin structure and spaced a distance from the second metal gate structure and an air gap structure is formed in the distance.

In a further embodiment the method also includes, after providing the first dummy gate structure and the second dummy gate structure, forming a first ILD layer; and also after forming the first metal gate structure and forming the second metal gate structure, removing the first ILD layer from over the active fin structure and the dielectric fin structure. The removing the first ILD layer provides an opening exposing the layer of high-k dielectric material for performing the reducing the thickness of the layer of the high-k dielectric material. In some implementations the method includes forming a dummy spacer element in the opening and subsequently removing the dummy spacer element to form the air gap structure.

In an embodiment, the method includes forming a second ILD in the opening after the reducing the thickness of the layer of the high-k dielectric material. In some implementations, forming the air gap structure includes removing a dummy spacer layer disposed over the layer of high-k dielectric material having the reduced thickness.

In another of the broader embodiments, a semiconductor device is provided that includes a first gate structure over an active fin structure and a second gate structure over a dielectric fin structure. A conductive structure is placed over the dielectric fin structure and spaced a distance from the second gate structure. A plurality of dielectric layers is formed in the distance. The plurality of dielectric layers include a high-k dielectric layer abutting sidewalls of the second gate structure; a first spacer element adjacent the high-k dielectric layer; an air gap adjacent the first spacer element; and a contact etch stop layer (CESL).

In a further embodiment, the device includes a seal layer on a top of the air gap and extending between the CESL and the first spacer element. In an embodiment, the dielectric fin structure includes another dielectric layer interfacing the second gate structure and the high-k dielectric layer. In an embodiment, the air gap has an L-shape. In some implementations, another air gap is disposed between the first gate structure and another conductive structure disposed over the active fin structure. The another conductive structure is a contact to a source/drain region adjacent the first gate structure in some implementations.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a fin structure and a hybrid fin structure over a substrate, wherein the hybrid fin structure comprises a dielectric material, and wherein the forming the hybrid fin structure includes forming a bottom layer and a top layer, wherein the top layer is high-k dielectric material;
    forming a dummy gate structure over the top layer of the hybrid fin structure;
    etching a region of the high-k dielectric material of the hybrid fin structure adjacent the dummy gate structure; and
    after etching the region, removing the dummy gate structure, wherein the removing the dummy gate structure includes etching the top layer of the hybrid fin structure to expose the bottom layer of the hybrid fin structure;
    after removing the dummy gate structure, forming a gate structure over the fin structure and the hybrid fin structure;
    providing a dummy spacer feature adjacent the gate structure and over the hybrid fin structure;
    providing a contact element over the hybrid fin structure, wherein the dummy spacer feature interposes the gate structure and the contact element; and
    removing the dummy spacer feature to form an air gap.

2. The method of claim 1, further comprising:
    forming a first spacer between the dummy spacer feature and the gate structure over the hybrid fin structure.

3. The method of claim 1, further comprising:
    after providing the dummy spacer feature and prior to providing the contact element, depositing a contact etch stop layer over the dummy spacer feature.

4. The method of claim 1, wherein the bottom layer is an oxide or low-k material.

5. The method of claim 1, further comprising: thinning the top layer of the hybrid fin structure after the removing the dummy gate structure and after the etching the region of the high-k dielectric material adjacent the dummy gate structure.

6. The method of claim 1, wherein the removing the dummy spacer feature to form the air gap forms a first air gap over the hybrid fin structure and a second air gap over the fin structure.

7. The method of claim 1, further comprising: forming a seal layer over the air gap.

8. The method of claim 1, wherein the gate structure is formed directly on the exposed bottom layer.

9. A method, comprising:
    forming an active fin structure and a dielectric fin structure over a substrate, wherein the dielectric fin structure comprises a layer of high-k dielectric material;
    providing a first dummy gate structure over the active fin structure and a second dummy gate structure over the layer of high-k dielectric material of the dielectric fin structure;
    recessing source/drain regions of the active fin structure and the dielectric fin structure adjacent the first and second dummy gate structures respectively;
    removing the first dummy gate structure to expose a channel region of the active fin structure and removing the second dummy gate structure, wherein the removing the second dummy gate structure etches an opening in the layer of high-k dielectric material;
    forming a first metal gate structure over the channel region of the active fin structure and forming a second metal gate structure within the opening in the layer of high-k dielectric material;
    after forming the second metal gate structure, reducing a thickness of the layer of high-k dielectric material adjacent the second metal gate structure;
    forming a conductive contact over the dielectric fin structure and spaced a distance from the second metal gate structure; and
    forming an air gap structure in the distance.

10. The method of claim 9, further comprising:
    after providing the first dummy gate structure and the second dummy gate structure, forming a first ILD layer; and
    after forming the first metal gate structure and forming the second metal gate structure, removing the first ILD layer from over the active fin structure and the dielectric fin structure, wherein the removing the first ILD layer provides an opening exposing the layer of high-k dielectric material for performing the reducing the thickness of the layer of the high-k dielectric material.

11. The method of claim 10, further comprising: forming a dummy spacer element in the opening; and subsequently removing the dummy spacer element to form the air gap structure.

12. The method of claim 10, further comprising: forming a second ILD in the opening after the reducing the thickness of the layer of the high-k dielectric material.

13. The method of claim 9, wherein the forming the air gap structure includes removing a dummy spacer layer disposed over the layer of high-k dielectric material having the reduced thickness.

14. A method of fabricating a semiconductor device, comprising:
    forming a fin structure and a hybrid fin structure over a substrate, wherein the hybrid fin structure comprises a first dielectric layer and a second dielectric layer, wherein the second dielectric layer has a greater dielectric constant (k) than the first dielectric layer;
    removing a dummy structure to form an opening over the hybrid fin structure, wherein the forming the opening includes removing a portion of the second dielectric layer underlying the dummy structure to expose a surface of the first dielectric layer, the opening having sidewalls defined by the first dielectric layer;
    forming a gate structure over the fin structure and in a bottom portion of the opening interfacing the sidewalls defined by the first dielectric layer and on the exposed surface of the first dielectric layer of the hybrid fin structure, wherein the gate structure includes a gate dielectric layer and an electrode;
    providing a dummy spacer feature adjacent the gate structure and over the hybrid fin structure;
    removing the dummy spacer feature to form an air gap; and
    forming a seal layer on a top of the air gap.

15. The method of claim 14, further comprising:
    after providing the dummy spacer feature, depositing a contact etch stop layer (CESL).

16. The method of claim 15, further comprising: forming a second spacer layer adjacent the second dielectric layer on sidewalls of the gate structure; and
    wherein the providing the dummy spacer feature forms the dummy spacer feature on the second spacer layer.

17. The method of claim 16, wherein the air gap extends from the CESL to the second spacer layer.

18. The method of claim 14, wherein the forming the seal layer includes depositing at least one of SiN, HfSi, AlON, HfO, LaO, AlO, LaO, ZrN, SiC, ZnO, SiOC, SiOCN, YO, TaCN, ZrSi, SiCN, ZrAlO, TiO, TaO, or ZrO.

19. The method of claim 14, wherein the first dielectric layer is a low-k dielectric material and the second dielectric layer is high-k dielectric material.

20. The method of claim 14, wherein the forming the opening includes forming a dummy gate structure and removing the dummy gate structure to define the opening.

* * * * *